US012791951B2

(12) United States Patent
Shimoaki et al.

(10) Patent No.: US 12,791,951 B2
(45) Date of Patent: Nov. 10, 2026

(54) SUBSTRATE TREATMENT METHOD AND SUBSTRATE TREATMENT APPARATUS

(71) Applicant: Tokyo Electron Limited, Tokyo (JP)

(72) Inventors: Takeshi Shimoaoki, Koshi City (JP); Arnaud Alain Jean Dauendorffer, Leuven (BE); Keisuke Yoshida, Nirasaki City (JP); Shinichiro Kawakami, Koshi City (JP); Yuya Kamei, Koshi City (JP); Soichiro Okada, Leuven (BE); Takafumi Niwa, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 469 days.

(21) Appl. No.: 18/416,087

(22) Filed: Jan. 18, 2024

(65) Prior Publication Data

US 2024/0248413 A1 Jul. 25, 2024

(30) Foreign Application Priority Data

Jan. 20, 2023 (JP) ................................ 2023-007596
Aug. 10, 2023 (JP) ................................ 2023-131191

(51) Int. Cl.

*G03F 7/00* (2006.01)
*G03F 7/004* (2006.01)
*G03F 7/16* (2006.01)
*G03F 7/20* (2006.01)
*H10P 76/40* (2026.01)

(52) U.S. Cl.

CPC ........ *G03F 7/706837* (2023.05); *G03F 7/161* (2013.01); *G03F 7/168* (2013.01); *G03F 7/2002* (2013.01); *G03F 7/70008* (2013.01); *G03F 7/70625* (2013.01); *G03F 7/70633* (2013.01); *G03F 7/70866* (2013.01); *H10P 76/4085* (2026.01); *G03F 7/0042* (2013.01)

(58) Field of Classification Search

CPC .... G03F 7/706837; G03F 7/161; G03F 7/168; G03F 7/2002; G03F 7/70008; G03F 7/70625; G03F 7/70633; G03F 7/70866; G03F 7/0042; G03F 7/40; G03F 7/16; G03F 7/3021; H10P 76/4085; H10P 76/2041

USPC .................................................. 430/326, 327

See application file for complete search history.

(56) References Cited

U.S. PATENT DOCUMENTS 5,093,279 A * 3/1992 Andreshak ............. H10P 95/00
438/662

FOREIGN PATENT DOCUMENTS

JP H05-326392 A 12/1993

* cited by examiner

*Primary Examiner* — Caleen O Sullivan

(74) *Attorney, Agent, or Firm* — Posz Law Group, PLC

(57) ABSTRACT

A substrate treatment method includes: developing a substrate which has a coating film of an inorganic resist formed on a base film thereon and has been subjected to an exposure treatment, with a developing solution to form a pattern of the inorganic resist; supplying an embedding solution to the developed substrate to fill a space between adjacent protrusions of the pattern; drying the filled embedding solution to form an embedded film on the substrate; and reducing a thickness of the embedded film by an ultraviolet ray.

9 Claims, 15 Drawing Sheets

SUBSTRATE TREATMENT METHOD AND SUBSTRATE TREATMENT APPARATUS

CROSS REFERENCE TO RELATED APPLICATIONS

This application is based upon and claims the benefit of priority of the prior Japanese Patent Application No. 2023-7596, filed in Japan on Jan. 20, 2023 and the prior Japanese Patent Application No. 2023-131191, filed in Japan on Aug. 10, 2023, the entire contents of which are incorporated herein by reference.

TECHNICAL FIELD

This disclosure relates to a substrate treatment method and a substrate treatment apparatus.

BACKGROUND

A semiconductor manufacturing method disclosed in Japanese Laid-open Patent Publication No. H5-326392 includes, in a step of developing a photosensitive film formed on a semiconductor substrate or a step of cleaning the semiconductor substrate after developing the photosensitive film, at least either a step of developing the photosensitive film using a developing solution lower in surface tension than pure water or a step of cleaning the semiconductor substrate using a cleaning solution lower in surface tension than pure water.

SUMMARY

An aspect of this disclosure is a substrate treatment method including: developing a substrate which has a coating film of an inorganic resist formed on a base film thereon and has been subjected to an exposure treatment, with a developing solution to form a pattern of the inorganic resist; supplying an embedding solution to the developed substrate to fill a space between adjacent protrusions of the pattern; drying the filled embedding solution to form an embedded film on the substrate; and reducing a thickness of the embedded film by an ultraviolet ray.

DETAILED DESCRIPTION

In photolithography in a manufacturing process of a semiconductor device or the like, a series of treatments is performed for forming a desired resist pattern on a substrate such as a semiconductor wafer (hereinafter, referred to as a "wafer"). The series of treatments includes, for example, a resist coating treatment of supplying a resist solution onto the substrate to form a coating film of the resist (hereinafter, a resist film), an exposure treatment of exposing the resist film in a predetermined pattern, a PEB (Post Exposure Bake) treatment of heating the substrate after the exposure so as to promote a chemical reaction in the exposed resist film, a developing treatment of developing the exposed resist film to form a pattern of the resist, and so on.

Conventionally, a chemically amplified resist is often used as the resist, but a non-chemically amplified inorganic resist (for example, a metal-containing resist or the like) is sometimes used in recent years. This inorganic resist is expected as a resist more suitable in a case of forming a fine pattern. However, even in the case of using the inorganic resist, collapse of the pattern, namely, pattern collapse being a type of defect may occur.

Hence, a technique relating to this disclosure suppresses occurrence of a defect such as the pattern collapse to obtain an excellent pattern of an inorganic resist.

Hereinafter, a substrate treatment method and a substrate treatment apparatus according to an embodiment will be explained with reference to the drawings. Note that, in this description and the drawings, components having substantially the same functional configurations are denoted by the same reference signs to omit duplicate explanations.

First Embodiment

Figure 1:
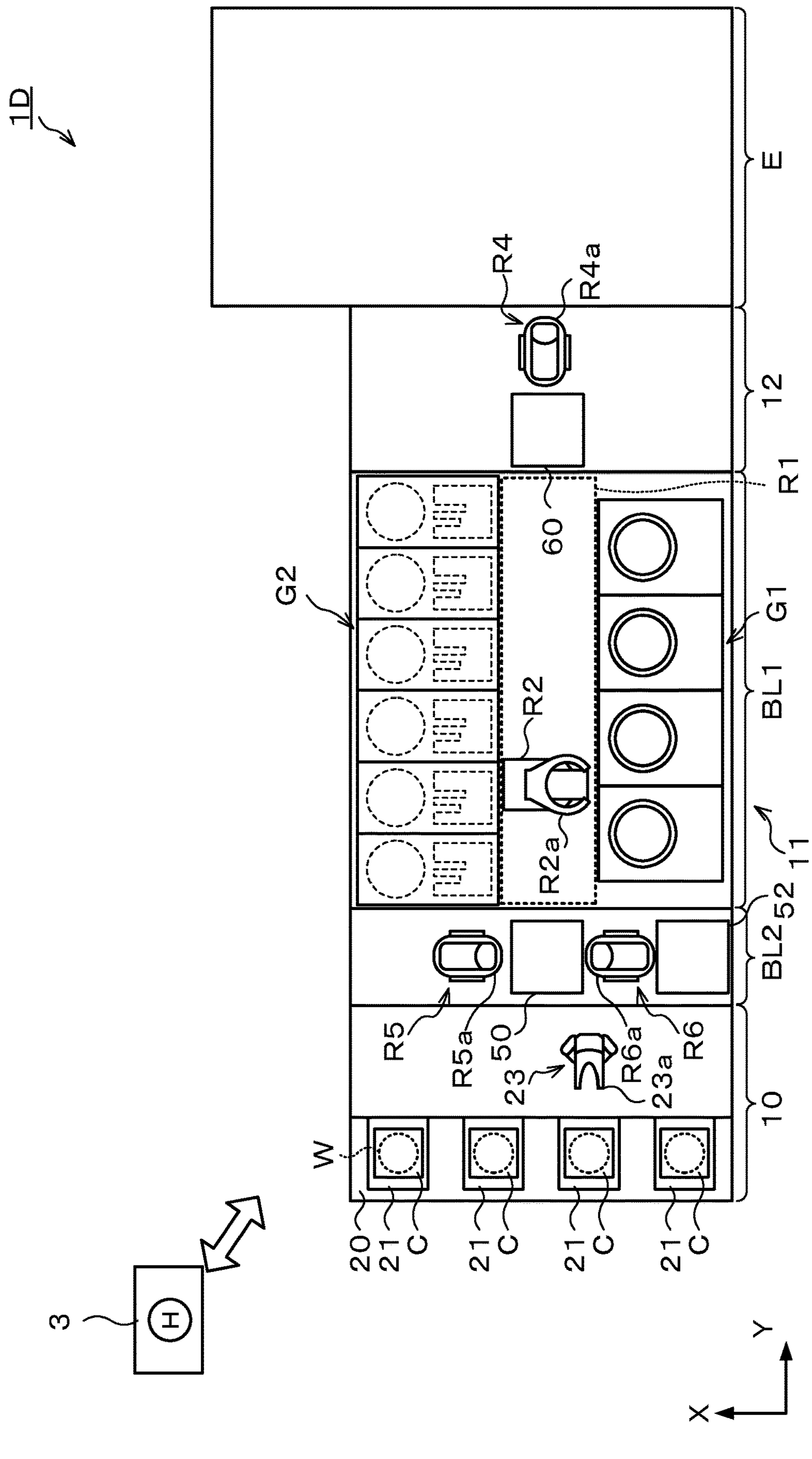
FIG. 1 is an explanatory view illustrating the outline of an internal configuration of a wafer treatment apparatus as a substrate treatment apparatus according to a first embodiment.
Figure 2:
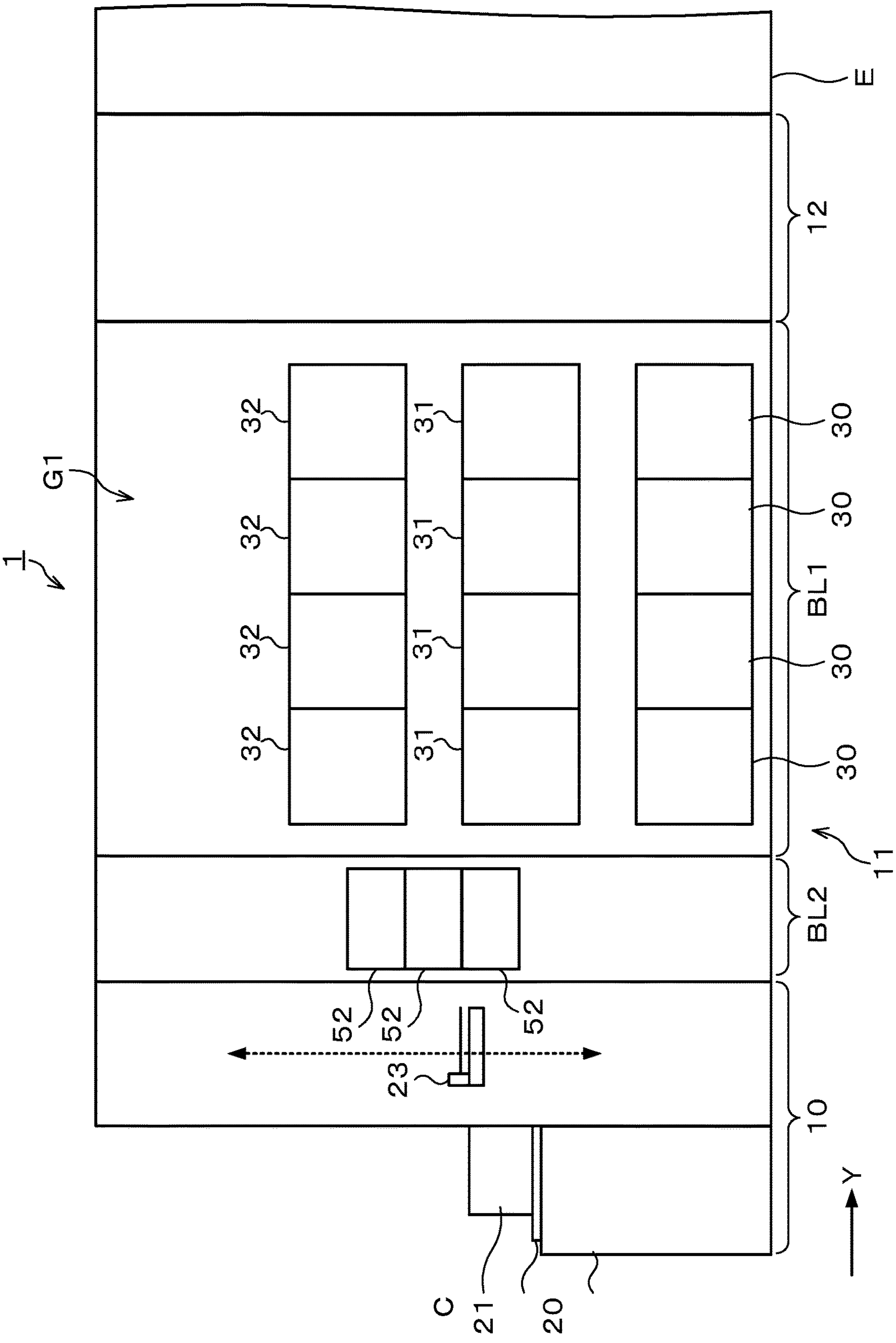
FIG. 2 is a view illustrating the outline of the internal configuration on the front side of the wafer treatment apparatus in FIG. 1.
Figure 3:
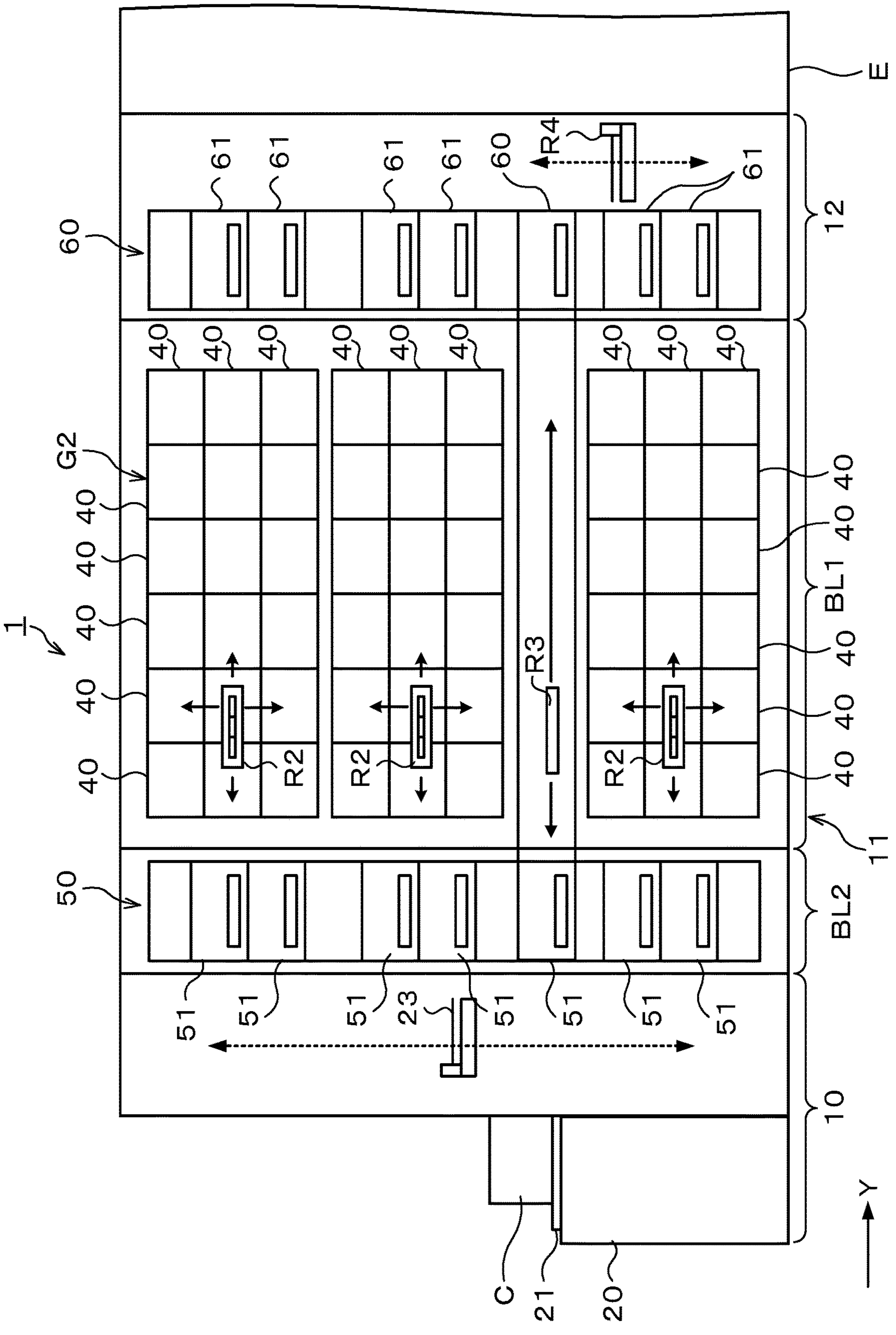
FIG. 3 is a view illustrating the outline of the internal configuration on the rear side of the wafer treatment apparatus in FIG. 1.

FIG. 1 is an explanatory view illustrating the outline of an internal configuration of a wafer treatment apparatus as a substrate treatment apparatus according to a first embodiment. FIG. 2 and FIG. 3 are views illustrating the outline of the internal configuration on the front side and the rear side of the wafer treatment apparatus in FIG. 1, respectively.

The wafer treatment apparatus 1 in FIG. 1 forms a pattern of an inorganic resist on a wafer W as a substrate. The inorganic resist used by the wafer treatment apparatus 1 is, for example, a metal-containing resist or a silicon (Si)-containing resist. The metal-containing resist contains, for example, a tin oxide as an inorganic component, and the Si-containing resist contains silicon as an inorganic component.

The wafer treatment apparatus 1 includes, as illustrated in FIG. 1 to FIG. 3, a cassette station 10, a treatment station 11, and an interface station 12, and is coupled to an exposure apparatus E. The exposure apparatus E performs an exposure treatment on the wafer W, specifically, performs the exposure treatment using, for example, EUV (Extreme Ultra-Violet) light. The cassette station 10, the treatment station 11, and the interface station 12 are provided in this order side by side in a horizontal direction and integrally connected. Further, the exposure apparatus E is coupled to the interface station 12 on the side opposite to the treatment station 11.

Note that a coupling direction of the interface station 12 and the exposure apparatus E is called a width direction, and a direction perpendicular to the coupling direction, namely, the width direction in top view is called a depth direction in the following.

To/from the cassette station 10, a cassette C that is a housing container configured to be able to house a plurality of wafers W is carried in/out.

In the cassette station 10, a cassette stage 20 is provided, for example, at an end portion on a width direction one side (Y-direction negative side in the drawing). On the cassette stage 20, a plurality of, for example, four stage plates 21 are provided. The stage plates 21 are provided side by side in a row in the depth direction (X-direction in FIG. 1). On the stage plates 21, the cassettes C can be mounted when the cassettes C are carried in/out from/to the outside of the wafer treatment apparatus 1.

Further, in the cassette station 10, a carrier module 23 which carries the wafer W is provided, for example, at a width direction other side (Y-direction positive side in the drawing). The carrier module 23 has a carrier arm 23*a* configured to be movable in the depth direction (X-direction in the drawing). Further, the carrier arm 23*a* of the carrier module 23 is configured to be movable also in a vertical direction and a direction around a vertical axis. The carrier module 23 can carry the wafer W between the cassette C on each of the stage plates 21 and a delivery module 51 in a later-explained delivery tower 50.

Note that in the cassette station 10, a storage section (not illustrated) where the cassette C is mounted and stored may be provided above the cassette stage 20 or at a portion farther away from the exposure apparatus E than the cassette stage 20 (Y-direction negative side portion in the drawing).

The treatment station 11 includes a plurality of various treatment modules which perform predetermined treatments such as a developing treatment and so on.

The treatment station 11 is divided into a plurality of (two in the example in the drawing) blocks each including various modules. A treatment block BL1 is provided on the interface station 12 side, and a delivery block BL2 is provided on the cassette station 10 side.

The treatment block BL1 has, for example, a first block G1 on a front side (X-direction negative side in FIG. 1) and has a second block G2 on a deep side (X-direction positive side in FIG. 1).

For example, in the first block G1, as illustrated in FIG. 2, a plurality of solution treatment modules, for example, developing modules 30 as developers and embedders, base film forming modules 31, and resist coating modules 32 are arranged in this order from the bottom.

The developing module 30 develops the wafer W with a developing solution, namely, develops the wafer in a wet mode. As the developing solution, for example, a mixed solution of propylene glycol monomethyl ether acetate (PGMEA) and acetic acid, 2-heptanone, or the like is used.

The development by the developing module 30, a pattern of the inorganic resist having many protrusions in a predetermined shape is formed on the wafer W. Note that in the case where the inorganic resist is a negative metal-containing resist, for example, a region where a condensation reaction has progressed in a film of the metal-containing resist after the exposure treatment and the PEB treatment becomes insoluble to fluid for the development such as the above developing solution and remains as the aforementioned pattern.

Further, the developing module 30 performs an embedding treatment on the wafer W. The embedding treatment supplies an embedding solution to the wafer W to fill a space between adjacent protrusions in the adjacent patterns of the inorganic resist. When the filled embedding solution is dried, an embedded film is formed on the wafer W.

The base film forming module 31 supplies a base film material being a treatment solution to the wafer W to form a base film of the coating film of the inorganic resist (hereinafter, an inorganic resist film). The base film is specifically an organic film, and more specifically a spin on carbon (SOC) film having a carbon content rate of 80% or more and 90% or less. In the case where fluorine-based gas is necessary for the etching of the base film using the pattern of the inorganic resist as a mask, a chamber of the etching apparatus may be contaminated. In this regard, in the case where the base film is an organic film, the base film can be etched with an oxygen-based gas, and therefore it is possible to suppress the contamination of the chamber. Further, it can be considered that by forming the SOC film having a carbon content rate of 80% or more and 90% or less as the base film, the adhesiveness with the inorganic resist film formed thereon improves to facilitate the formation of a fine pattern of the inorganic resist film without collapse.

The resist coating module 32 is a resist coater which applies the inorganic resist film to the wafer W to form an inorganic resist film.

For example, the developing module 30, the base film forming module 31, and the resist coating module 32 are arranged four each side by side in the width direction (Y-direction in the drawing). Note that the numbers and the arrangements of the developing modules 30, the base film forming modules 31, and the resist coating modules 32 can be arbitrarily selected.

In each of the developing module 30, the base film forming module 31, and the resist coating module 32, a predetermined treatment solution is applied onto the wafer W, for example, by the spin coating method. In the spin coating method, the treatment solution is discharged onto the wafer W, for example, from a discharge nozzle and the wafer W is rotated to diffuse the treatment solution over the surface of the wafer W. Note that the configuration of the developing module 30 will be explained later.

For example, in the second block G2, as illustrated in FIG. 3, a plurality of thermal treatment modules 40 are provided to line up in the vertical direction and the width direction (Y-direction in the drawing). The number and the arrangement of the thermal treatment modules 40 can also be arbitrarily selected.

The thermal treatment modules 40 perform thermal treatments such as a heat treatment and a cooling treatment on the wafer W.

In the treatment block BL1, as illustrated in FIG. 1, a carrier path R1 extending in the width direction is provided at a portion between the first block G1 and the second block G2. In the treatment block BL1, the plurality of developing modules 30, base film forming modules 31, and resist coating modules 32 are arranged in a manner to line up along the carrier path R1 extending in the width direction. In the carrier path R1, a carrier module R2 for carrying the wafer W is arranged.

The carrier module R2 has a carrier arm R2*a* movable, for example, in the width direction (Y-direction in the drawing), the vertical direction, and the direction around the vertical axis. The carrier module R2 can move the carrier arm R2*a* holding the wafer W in the carrier path R1 to carry the wafer W to a predetermined module in the first block G1, the second block G2, and the later-explained delivery tower 50 and delivery tower 60, which are located therearound. A plurality of the carrier modules R2 are arranged, for example, one above the other as illustrated in FIG. 3, and can carry the wafers W, for example, to predetermined modules at similar heights in the first block G1, the second block G2, and the delivery towers 50, 60.

Further, in the carrier path R1, a shuttle carrier module R3 is provided which linearly carries the wafer W between the delivery tower 50 and the delivery tower 60.

The shuttle carrier module R3 can move the supported wafer W linearly in the Y-direction to carry the wafer W between the module in the delivery tower 50 and the module in the delivery tower 60 at the similar heights.

In the delivery block BL2, as illustrated in FIG. 1, the delivery tower 50 is provided at the middle portion in the depth direction (X-direction in the drawing). The delivery tower 50 is specifically provided at a position, in the delivery block BL2, adjacent to the carrier path R1 in the treatment block BL1 in the width direction (Y-direction in the drawing). In the delivery tower 50, as illustrated in FIG. 3, a plurality of delivery modules 51 are provided in a manner to be stacked in the vertical direction.

Further, as illustrated in FIG. 1, a UV irradiation module 52 is provided as an ultraviolet irradiator at the end portion on the front side of the delivery block BL2. As illustrated in FIG. 2, the UV irradiation modules 52 may also be provided in a manner to be stacked in the vertical direction.

The UV irradiation module 52 irradiates the wafer W with an ultraviolet ray, specifically, irradiates the entire upper surface, namely, the entire surface of the wafer W with an ultraviolet ray under an oxygen-containing atmosphere.

The interface station 12 is provided between the treatment station 11 and the exposure apparatus E as illustrated in FIG. 1 and delivers the wafer W between them.

At a position, in the interface station 12, adjacent to the carrier path R1 in the treatment block BL1 in the width direction (Y-direction in the drawing), the delivery tower 60 is provided. In the delivery tower 60, as illustrated in FIG. 3, a plurality of delivery modules 61 are provided in a manner to be stacked in the vertical direction.

Further, as illustrated in FIG. 1, a carrier module R4 is provided in the interface station 12.

The carrier module R4 is provided at a position adjacent to the delivery tower 60 in the width direction (Y-direction in the drawing), and has a carrier arm R4*a* which is movable, for example, in the depth direction (X-direction in the drawing), the vertical direction, and the direction around the vertical axis. The carrier module R4 can carry the wafer W between the plurality of delivery modules 61 in the delivery tower 60 and the exposure apparatus E, while holding the wafer W by the carrier arm R4*a*.

Furthermore, carrier modules R5, R6 are provided in the delivery block BL2.

The carrier module R5 is provided on the deep side (X-direction positive side in the drawing) of the delivery tower 50, and has a carrier arm R5*a* which is movable, for example, in the vertical direction. The carrier module R5 can carry the wafer W between the plurality of delivery modules 51 in the delivery tower 50, while holding the wafer W by the carrier arm R5*a*.

The carrier module R6 is provided between the delivery tower 50 and the UV irradiation module 52, and has a carrier arm R6*a* which is movable, for example, in the vertical direction and the direction around the vertical axis. The carrier module R6 can carry the wafer W between the plurality of delivery modules 51 in the delivery tower 50 and the UV irradiation module 52, while holding the wafer W by the carrier arm R6*a*.

Further, the wafer treatment apparatus 1 is provided with a controller 3. The controller 3 processes computer-executable instructions which cause the wafer treatment apparatus 1 to execute various processes described in this disclosure. The controller 3 can be configured to control components of the wafer treatment apparatus 1 to execute the various processes described herein. In one embodiment, a part or all of the controller 3 may be included in the wafer treatment apparatus 1. The controller 3 may include a processor, a storage, and a communication interface. The controller 3 can be realized, for example, by the computer. The processor can be configured to read from the storage a program which provides a logic or routine making it possible to perform various control operations, and execute the read program to thereby perform the various control operations. This program may be stored in the storage in advance, or acquired via a medium when necessary. The acquired program is stored in the storage and read from the storage and executed by the processor. The medium may be computer-readable various storage media or may be a communication line connected to the communication interface. The storage medium may be a transitory one or a non-transitory one. The processor may be a CPU (Central Processing Unit). The storage may include a RAM (Random Access Memory), a ROM (Read Only Memory), an HDD (Hart Disk Drive), an SSD (Solid State Drive), or a combination of them. The communication interface may communicate with the wafer treatment apparatus 1 via a communication line such as a LAN (Local Area Network). A part or all of the controller 3 may be composed of a circuitry.

<Developing Module 30>

Figure 4:
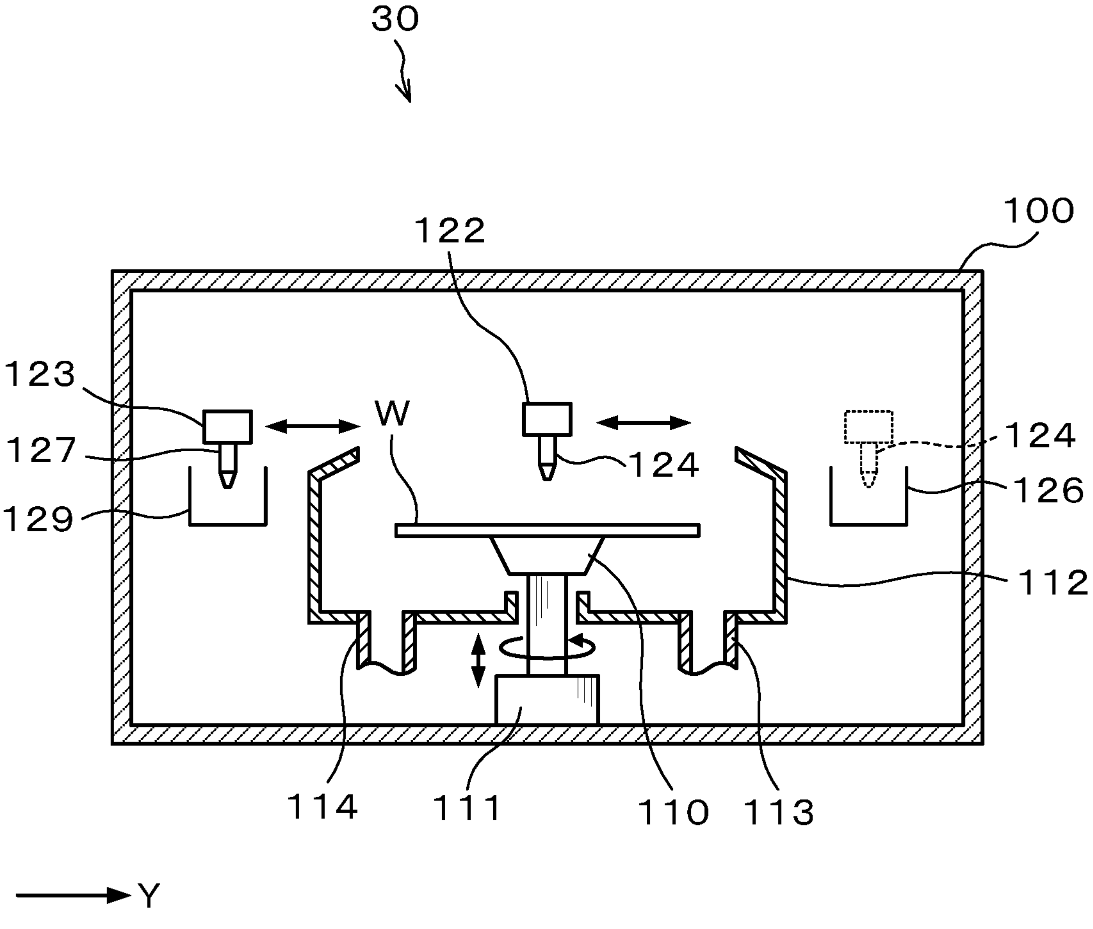
FIG. 4 is a longitudinal sectional view illustrating the outline of a configuration of a developing module.
Figure 5:
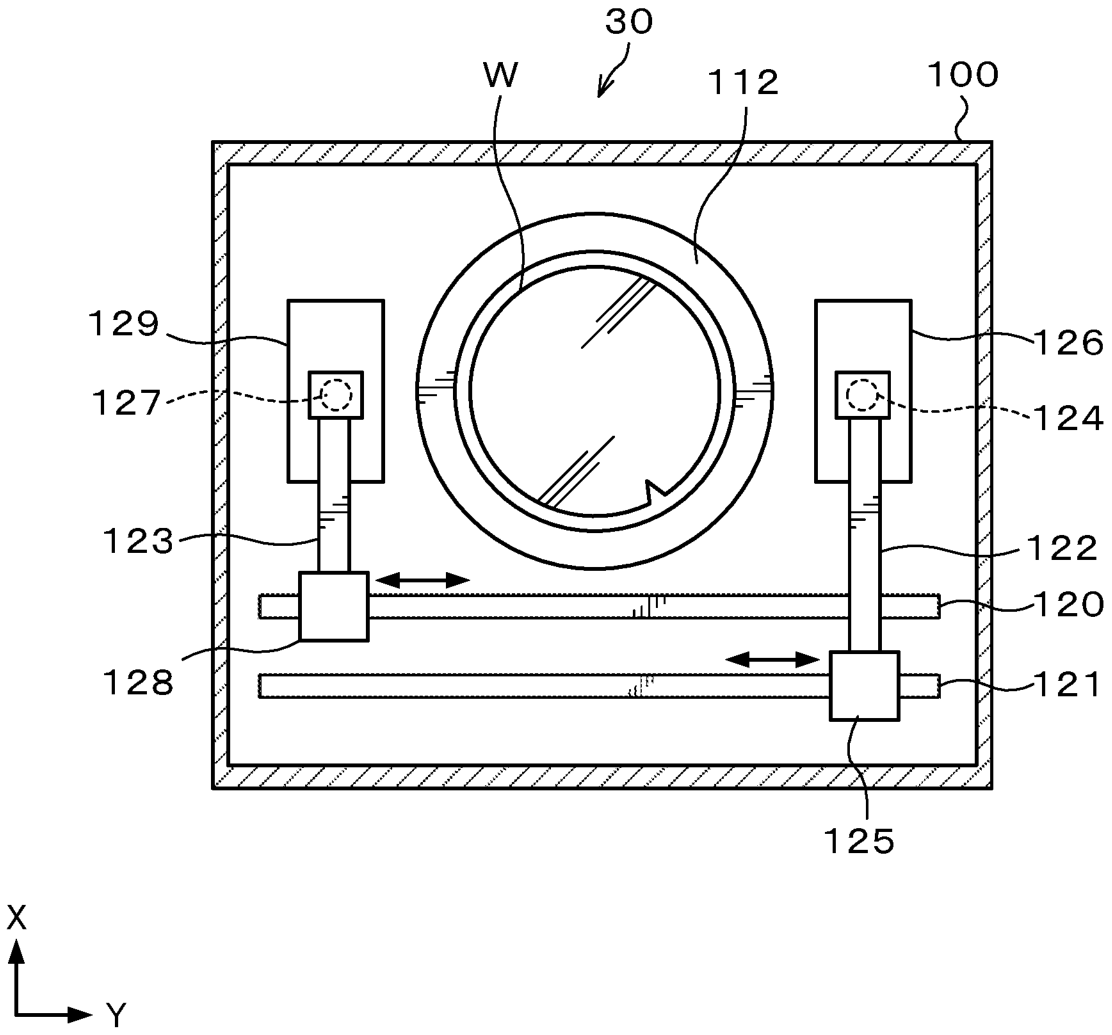
FIG. 5 is a transverse sectional view illustrating the outline of the configuration of the developing module.

Next, the configuration of the developing module 30 will be explained using FIG. 4 and FIG. 5. FIG. 4 and FIG. 5 are a longitudinal sectional view and a transverse sectional view schematically illustrating the outline of a configuration of the developing module 30, respectively.

The developing module 30 has a treatment container 100 whose inside is sealable as illustrated in FIG. 4 and FIG. 5. A side surface on the carrier module R2 side of the treatment container 100 is formed with a carry-in/out port (not illustrated) for the wafer W, and an opening and closing shutter (not illustrated) is provided at the carry-in/out port.

At a middle portion in the treatment container 100, a spin chuck 110 as a substrate holder is provided. The spin chuck 110 is for holding the wafer W and is configured to be rotatable. Further, the spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive 111 as a rotation mechanism is provided. The chuck drive 111 is provided with, for example, a motor or the like and can rotate the spin chuck 110 at a desired seed. This can rotate the wafer W held on the spin chuck 110 at a desired speed. Further, the chuck drive 111 is provided with, for example, a raising and lowering drive source such as a cylinder so that the spin chuck 110 can freely rise and lower.

Around the spin chuck 110, a cup 112 is provided which receives and collects liquid splashing or dropping from the wafer W. A drain pipe 113 that drains the collected liquid and an exhaust pipe 114 that vacuums and exhausts the atmosphere inside the cup 112 are connected to a lower surface of the cup 112.

As illustrated in FIG. 5, on an X-direction negative direction (lower direction in FIG. 5) side of the cup 112, rails 120, 121 extending along a Y-direction (right-left direction in FIG. 5) are formed. The rails 120, 121 are each formed, for example, from a Y-direction negative direction (left direction in FIG. 5) side outer position of the cup 112 to a Y-direction positive direction (right direction in FIG. 5) side outer position. To the rails 120, 121, a first arm 122 and a second arm 123 are attached, respectively.

On the first arm 122, a developing solution nozzle 124 is supported which discharges a developing solution and supplies it onto the wafer W as illustrated in FIG. 4 and FIG. 5.

The first arm 122 is movable on the rail 120 by a nozzle drive 125 illustrated in FIG. 5. Thus, the developing solution nozzle 124 can move from a waiting section 126 provided at a Y-direction negative direction side outer position of the cup 112 to above a central portion of the wafer W in the cup 112. Further, the first arm 122 can freely rise and lower by the nozzle drive 125 and adjust the height of the developing solution nozzle 124.

To the developing solution nozzle 124, a supply source (not illustrated) of the developing solution is connected. Further, a supply pipe (not illustrated) between the developing solution nozzle 124 and the supply source of the developing solution is provided with a supply equipment group including a valve, a flow regulator, and so on for controlling the flow of the developing solution.

On the second arm 123, an embedding solution nozzle 127 is supported which discharges an embedding solution and supplies it onto the wafer W as illustrated in FIG. 4 and FIG. 5. The embedding solution is, for example, an organic treatment solution which forms an organic film as an embedded film, specifically, an organic polymer solution, for example, using an organic polymer as a solute and an organic solvent as a solvent. The embedded film formed with the embedding solution and the base film formed by the base film forming module 31 may be organic films of the same type. The "same type" herein means types which are at similar levels in resistance against etching by the ultraviolet irradiation under the oxygen-containing atmosphere.

The second arm 123 is movable on the rail 121 by a nozzle drive 128 as a moving mechanism illustrated in FIG. 5. Thus, the embedding solution nozzle 127 can move from a waiting section 129 provided at a Y-direction negative direction side outer position of the cup 112 to above a peripheral edge portion of the wafer W in the cup 112. Further, the second arm 123 can freely rise and lower by the nozzle drive 128 and adjust the height of the embedding solution nozzle 127.

To the embedding solution nozzle 127, a supply source (not illustrated) of the embedding solution is connected. Further, a supply pipe (not illustrated) between the embedding solution nozzle 127 and the supply source of the embedding solution is provided with a supply equipment group including a valve, a flow regulator, and so on for controlling the flow of the embedding solution.

Note that the configurations of the base film forming module 31 and the resist coating module 32 are the same as the configuration of the developing module 30. However, the number of the discharge nozzles which discharge the treatment solution and the treatment solution supplied from the discharge nozzles are different among the base film forming module 31, the resist coating module 32, and the developing module 30.

<Example of the Treatments by the Wafer Treatment Apparatus 1>

Figure 6:
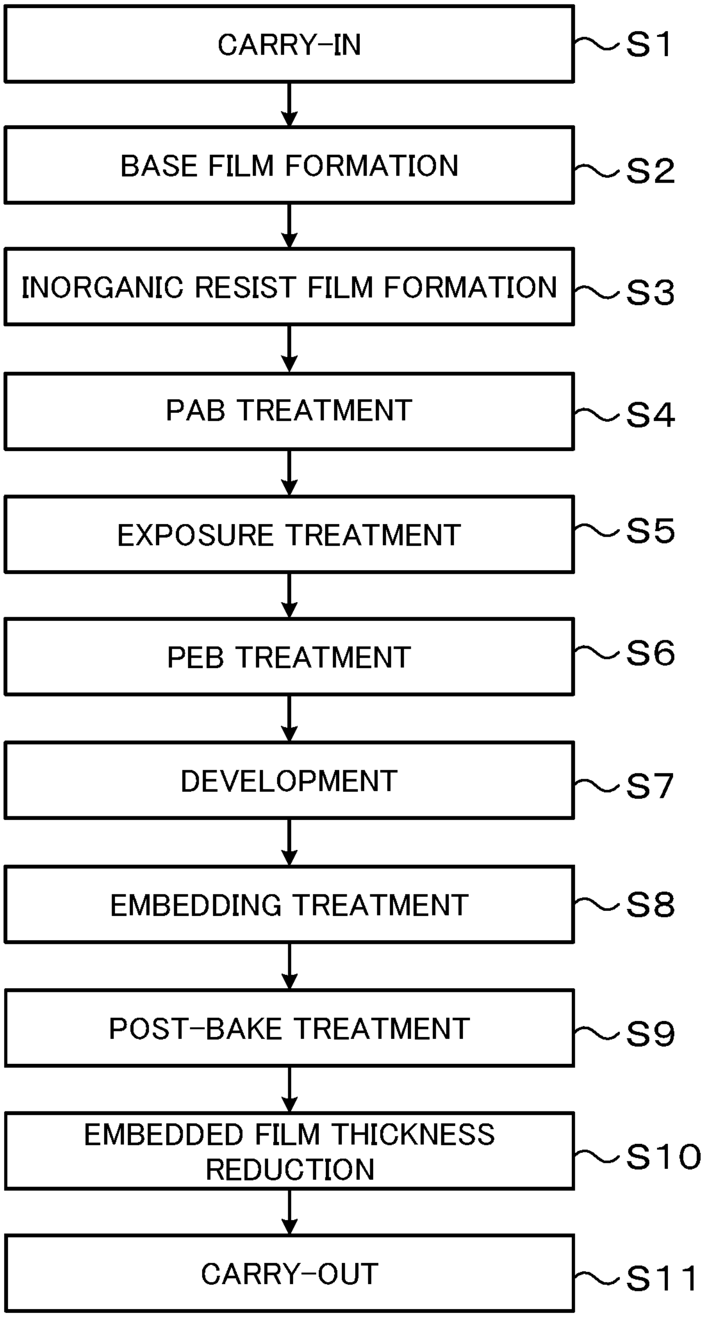
FIG. 6 is a flowchart illustrating main processes of an example of the treatments by the wafer treatment apparatus in FIG. 1.
Figure 7:
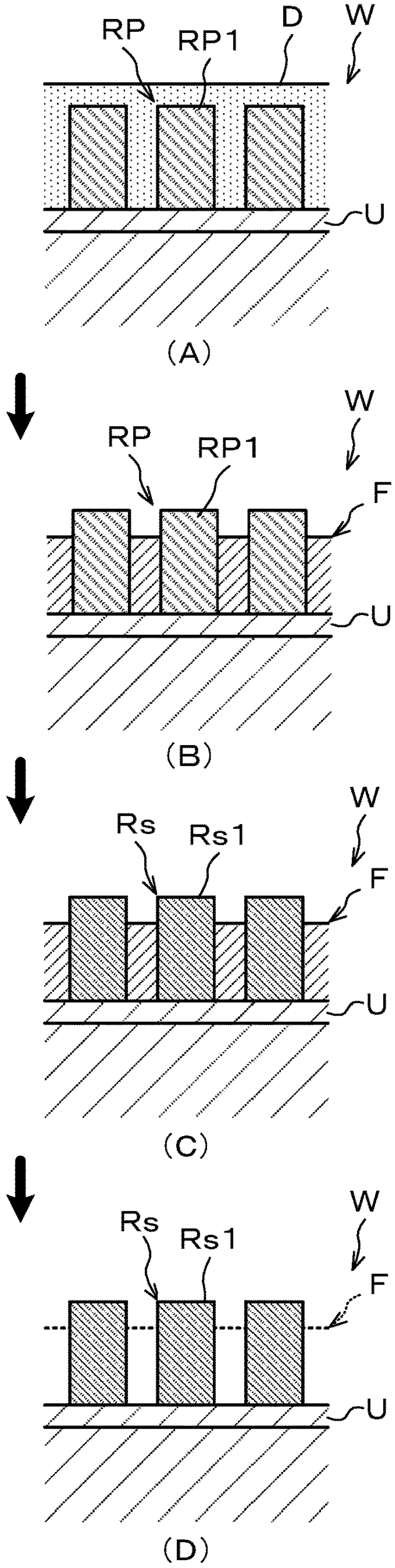
FIG. 7 is a partially enlarged sectional view schematically illustrating the state of the wafer in each process of the treatments by the wafer treatment apparatus in FIG. 1.

Next, an example of the treatments by the wafer treatment apparatus 1 will be explained. FIG. 6 is a flowchart illustrating main processes of the example of the treatments by the wafer treatment apparatus 1. FIG. 7 is a partially enlarged sectional view schematically illustrating the state of the wafer W in each process of the treatments. Note that each process in the following is executed under the control of the controller 3 based on the program stored in the program storage (not illustrated).

First, the wafer W is carried into the wafer treatment apparatus 1 (Step S1).

Specifically, for example, the wafer W is first taken out by the carrier module 23 from the cassette C on the cassette stage 20 and carried to the delivery module 51 in the delivery tower 50 in the delivery block BL2.

Next, a base film forming treatment is performed on the wafer W to form a base film on the wafer W.

Specifically, for example, the wafer W is carried by the carrier module R2 to the base film forming module 31 in the treatment block BL1, and the base film material is applied by rotation on the surface of the wafer W to form a base film such as an SOC film so as to cover the surface of the wafer W.

Then, a resist coating treatment is performed on the wafer W to form an inorganic resist film on the wafer W (Step S3).

Specifically, for example, the wafer W is carried by the carrier module R2 to the resist coating module 32, and a negative metal-containing resist as the inorganic resist is applied by rotation on the surface of the wafer W to form an inorganic resist film such as a coating film of the metal-containing resist (hereinafter, "metal-containing resist film") so as to cover the surface of the wafer W.

Subsequently, a pre-applied bake (PAB) treatment is performed on the wafer W (Step S4).

Specifically, the wafer W is carried to the thermal treatment module 40 for the PAB treatment, and a heat treatment is performed on the wafer W. Then, the wafer W is carried to the delivery module 61 in the delivery tower 60 in the interface station 12.

Next, an exposure treatment is performed on the wafer W (Step S5).

Specifically, for example, the wafer W is carried by the carrier module R4 to the exposure apparatus E, and a predetermined pattern formed in a mask is transferred by EUV light to the inorganic resist film on the wafer W. The above predetermined pattern is, for example, a line-and-space pattern with a 30 nm pitch. The wafer W is then carried by the carrier module R4 to the delivery module 61 in the delivery tower 60.

Then, a PEB treatment (post exposure bake treatment) is performed on the wafer W (Step S6).

Specifically, for example, the wafer W is carried by the carrier module R2 to the thermal treatment module 40 for the PEB treatment, and a heat treatment is performed on the wafer W.

Subsequently, the wafer W is developed (Step S7).

Specifically, for example, the wafer W is carried by the carrier module R2 to the developing module 30, and a developing treatment using the developing solution, namely, a developing treatment in a wet mode is performed on the wafer W.

More specifically, the wafer W is carried by the carrier module R2 into the developing module 30 and suction-held on the spin chuck 110.

Subsequently, the developing solution nozzle 124 on the waiting section 126 moves to above the central portion of the wafer W suction-held by the spin chuck 110. Thereafter, in a state where the wafer W is being rotated by the spin chuck 110, the developing solution is discharged from the developing solution nozzle 124 and supplied onto the surface of the wafer W. The supplied developing solution is diffused over the entire surface of the wafer W by the centrifugal force to form a developing solution puddle covering the entire surface of the wafer W. Next, the discharge of the developing solution is stopped and a stand development of keeping the wafer W standing still for a predetermined time is performed. With this, the development of the resist film on the wafer W progresses to form a pattern RP of the inorganic resist having many protrusions RP1 in a predetermined shape on a base film U on the wafer W as illustrated in FIG. 7(A).

Note that, thereafter, a cleaning solution may be supplied from a cleaning solution nozzle (not illustrated) onto the surface of the wafer W to remove the developing solution.

Further, in one embodiment, the wafer W remains in a wet state until start of an embedding treatment process at Step S8 being the next process. The state of the wafer W remaining wet concretely means, for example, a state where a developing solution D remains on the entire wafer W as illustrated in FIG. 7(A), and means a state where the cleaning solution remains on the entire wafer W in the case where the cleaning solution is supplied after the supply of the developing solution.

After the development, an embedding treatment is performed on the wafer W (Step S8). Specifically, an embedding solution is supplied to the wafer W to fill the space between adjacent protrusions RP1 in the pattern RP of the inorganic resist, and then the embedding solution is dried to form an embedded film F on the wafer W as illustrated in FIG. 7(B).

The embedding treatment is performed by the developing module 30.

Specifically, for example, the embedding solution nozzle 127 on the waiting section 129 moves to above the central portion of the wafer W suction-held by the spin chuck 110. Thereafter, in a state where the wafer W remaining wet as explained above is being rotated by the spin chuck 110, the embedding solution is discharged from the embedding solution nozzle 127 and supplied onto the surface of the wafer W. The supplied embedding solution is diffused over the entire surface of the wafer W by the centrifugal force and fills the space between the adjacent protrusions RP1 in the pattern RP of the inorganic resist on the entire surface of the wafer W. Thereafter, the discharge of the embedding solution is stopped, in which state the wafer is rotated and the embedding solution is dried, resulting in the formation of an embedded film F in the wafer W as illustrated in FIG. 7(B). The thickness of the formed embedded film F is, for example, 20% to 90% of the height of the protrusion RP1 of the pattern RP of the inorganic resist.

Further, the embedded film F is an organic film. The embedded film F may be an organic film of the same type as the base film U as explained above. A relation, in carbon content, of the inorganic resist film (namely, the pattern RP of the inorganic resist)<the embedded film F<the base film U is a preferable example.

The formation of the embedded film F can suppress the collapse of the pattern RP of the inorganic resist, specifically, can suppress collapse of the protrusion RP1 of the pattern RP of the inorganic resist. More specifically, it is possible to prevent the protrusion RP1 of the pattern RP of the inorganic resist from peeling off the base film U and collapsing.

Next, a post-bake treatment is performed on the wafer W (Step S9).

Specifically, for example, the wafer W is carried by the carrier module R2 to the thermal treatment module 40 for the post-bake treatment, and a heat treatment is performed on the wafer W. This solidifies the pattern RP of the inorganic resist. In other words, as illustrated in FIG. 7(C), a pattern Rs of the inorganic resist having a solidified protrusion Rs1 is formed on the wafer W. The solidification of the pattern RP of the inorganic resist improves the degree of adhesion between the pattern Rs of the inorganic resist and the base film U. Further, the post-bake treatment further dries the embedded film F.

Subsequently, the thickness of the embedded film F is reduced (Step S10).

Specifically, for example, the wafer W is carried by the carrier module R2 to the delivery module 51 in the delivery tower 50 in the delivery block BL2. Then, the wafer W is carried by carrier module R6 to the UV irradiation module 52, and an ultraviolet irradiation treatment is performed on the wafer W to remove the whole embedded film F as illustrated, for example, in FIG. 7(D). In the UV irradiation module 52, the entire surface of the wafer W is irradiated with an ultraviolet ray under an oxygen-containing atmosphere (specifically, for example, under an atmospheric gas atmosphere), and thereby the embedded film F on the wafer W is removed by ozone generated by the ultraviolet ray in a surrounding atmosphere. After the ultraviolet irradiation treatment, the wafer W is carried to the delivery module 51 in the delivery tower 50.

Then, the wafer W is carried out of the wafer treatment apparatus 1 (Step S11).

Specifically, the wafer W is returned to the cassette C in a procedure reverse to that at Step S1.

This completes the series of treatments by the wafer treatment apparatus 1 is completed.

Note that the wafer W is then carried, for example, to an etching apparatus (not illustrated) outside the wafer treatment apparatus 1. In the outside etching apparatus, etching of the base film U or the like is performed using the pattern of the inorganic resist as a mask.

Besides, in the case where the embedded film and the base film are organic films of the same type, removal, namely, etching of the base film using the pattern of the inorganic resist as a mask may be additionally performed at the embedded film thickness reduction process at Step S10. This can simplify the series of processes until an etching target film below the base film is etched using the pattern of the inorganic resist as a mask.

<Main Effects of the First Embodiment>

As explained above, the wafer treatment apparatus 1 executes a process of developing the wafer W which has the inorganic resist film formed on the base film U and has been subjected to the exposure treatment, with the developing solution to form the pattern of the inorganic resist. Further, the wafer treatment apparatus 1 executes the process of supplying the embedding solution to the developed wafer to fill the space between the adjacent protrusions in the pattern of the inorganic resist, and the process of drying the filled embedding solution to form the embedded film on the wafer W. Therefore, according to the wafer treatment apparatus 1, at least a bottom of the protrusion in the pattern of the inorganic resist formed by the development can be supported by the embedded film. Accordingly, it is possible to suppress the occurrence of the collapse of the pattern of the inorganic resist. Specifically, it is possible to suppress the occurrence of the collapse of the pattern of the inorganic resist until the pattern of the inorganic resist is solidified and the degree of adhesiveness with the base film increases. More specifically, it is possible to suppress the occurrence of the collapse of the pattern of the inorganic resist due to the peeling from the base film or the like at least until the completion of the post-bake treatment.

The wafer treatment apparatus 1 dries the embedding solution to form the embedded film, and then further executes the process of reducing the thickness of the embedded film with the ultraviolet ray. In other words, in the wafer treatment apparatus 1, the embedding solution is dried and then removed. Unlike this, removal of the embedding solution in a liquid form without drying is conceivable. However, in this method, the pattern of the inorganic resist may collapse by the surface tension of the embedding solution, namely, by a capillary phenomenon due to the embedding solution. In contrast to the above, in the wafer treatment apparatus 1, the embedding solution is dried and then removed as explained above, so that it is possible to prevent the surface tension of the embedding solution from acting on the protrusion of the pattern of the inorganic resist at the removal, and therefore suppress the collapse of the pattern of the inorganic resist due to the surface tension.

As explained above, according to this embodiment, it is possible to suppress the collapse of the pattern of the inorganic resist and therefore to obtain an excellent pattern of the inorganic resist.

The present inventors compared the minimum line widths causing no pattern collapse between the case of forming the embedded film as in this embodiment and the case of not forming the embedded film, for the line-and-space pattern of the inorganic resist. In the case of not forming the embedded film, the minimum line width was about 17.7 nm, whereas in the case of forming the embedded film, the minimum line width was about 15.6 nm. This result reveals that this embodiment can suppress the collapse of the pattern of the inorganic resist.

Further, in this embodiment, the wafer treatment apparatus 1 executes the process of reducing the thickness of the embedded film and therefore can reduce the load of removing the embedded film outside the wafer treatment apparatus 1. For example, in the case of performing etching of the base film using the pattern of the inorganic resist as a mask in the etching apparatus outside the wafer treatment apparatus 1, the load of removing the embedded film in the outside etching apparatus can be reduced.

Further, in this embodiment, the embedding solution is supplied to the wafer W remaining in a wet state. In this case, it is possible to suppress collapse of the pattern of the inorganic resist due to the surface tension of the treatment solution such as the developing solution before the supply of the embedding solution.

Second Embodiment

Figure 8:
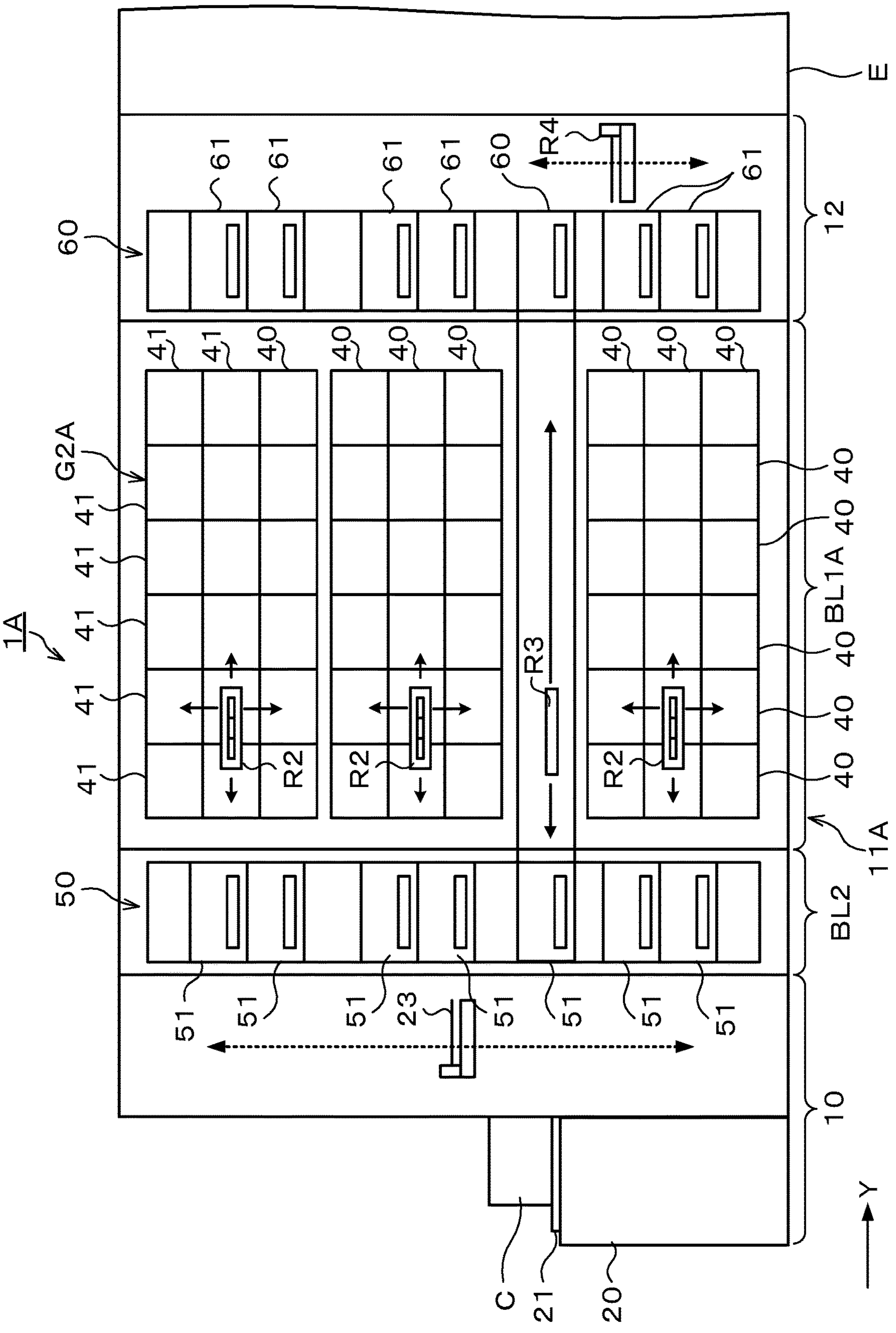
FIG. 8 is a view illustrating the outline of an internal configuration on the rear side of a wafer treatment apparatus as a substrate treatment apparatus according to a second embodiment.

FIG. 8 is a view illustrating the outline of an internal configuration on the rear side of a wafer treatment apparatus as a substrate treatment apparatus according to a second embodiment.

According to the experiments carried out by the present inventors, in the case of irradiating the base film before the formation of the inorganic resist film (specifically, a tin-containing resist film) with the ultraviolet ray, the occurrence rate of the pattern collapse was lower in the irradiation under the oxygen-containing atmosphere (specifically, the atmospheric gas atmosphere) than in the irradiation under the nitrogen atmosphere.

This can be considered because OH groups increased on the surface of the base film due to the ultraviolet irradiation under the oxygen-containing atmosphere, namely, the hydrophilic property of the surface of the base film increased, resulting in that a lower part of the protrusion of the pattern of the inorganic resist became wide to improve the adhesiveness between the pattern of the inorganic resist and the base film.

A wafer treatment apparatus 1A in FIG. 8 is made based on the above result of the experiments, and includes a UV irradiation module 41 as another ultraviolet irradiator in addition to the configuration of the wafer treatment apparatus 1 illustrated in FIG. 1 and so on. The UV irradiation module 41 irradiates the wafer W with an ultraviolet ray, specifically, irradiates the entire upper surface of the wafer W, namely, the entire surface with an ultraviolet ray under the oxygen-containing atmosphere as in the above UV irradiation module 52.

A plurality of the UV irradiation modules 41 are provided to line up in the vertical direction and the width direction (Y-direction in the drawing) as with the thermal treatment modules 40, in a second block G2A of a treatment block BL1A of a treatment station 11A. The number and the arrangement of the UV irradiation modules 41 can also be arbitrarily selected.

<Example of the Treatments by the Wafer Treatment Apparatus 1A>

Figure 9:
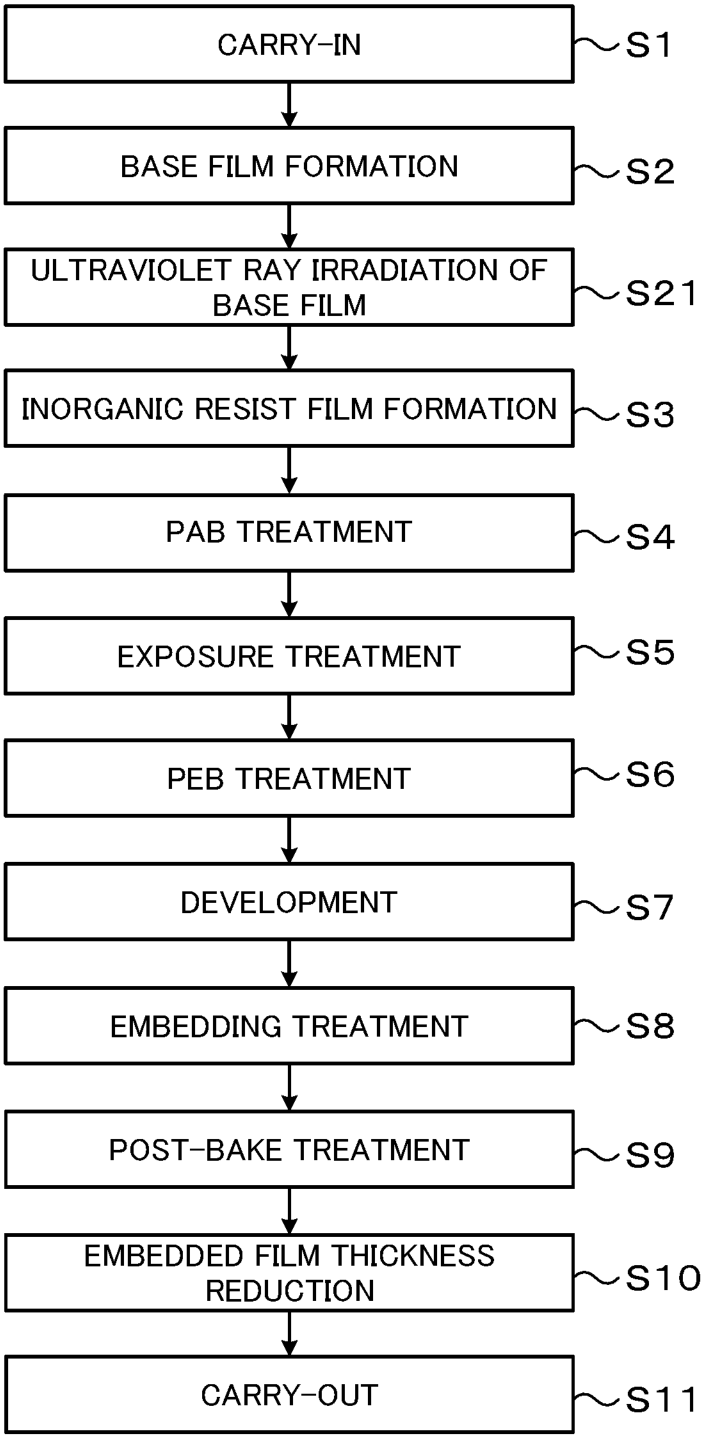
FIG. 9 is a flowchart illustrating main processes of an example of the treatments by the wafer treatment apparatus in FIG. 8.

FIG. 9 is a flowchart illustrating main processes of the example of the treatments by the wafer treatment apparatus 1A.

In the treatments by the wafer treatment apparatus 1A, for example, treatments up to the base film formation process at Step S2 in the treatments by the wafer treatment apparatus 1 are performed as illustrated in FIG. 9, and then the entire surface of the wafer W, namely, the entire base film is irradiated with the ultraviolet ray.

Specifically, the wafer W is carried by the carrier module R2 to the UV irradiation module 41, and the entire surface of the wafer W is irradiated with the ultraviolet ray under an oxygen-containing atmosphere (specifically, for example, under an atmospheric gas atmosphere). Thus, the entire surface of the base film on the wafer W is hydrophilized by ozone generated by the ultraviolet ray in the surrounding atmosphere. In other words, the ozone increases the OH groups on the surface of the base film on the wafer W.

Thereafter, Step S3 and subsequent steps in the treatments by the wafer treatment apparatus 1 are performed.

<Main Effects of the Second Embodiment>

In this embodiment, the base film is irradiated with the ultraviolet ray under the oxygen-containing atmosphere before the inorganic resist film is formed on the base film, thereby making it possible to hydrophilize the surface of the base film on the wafer W as explained above. Therefore, it is possible to make a lower part of the protrusion of pattern wide when the pattern of the inorganic resist is formed on the base film. Accordingly, it is possible to improve the adhesiveness between the pattern of the inorganic resist and the base film, and further suppress the pattern collapse.

Third Embodiment

Figure 10:
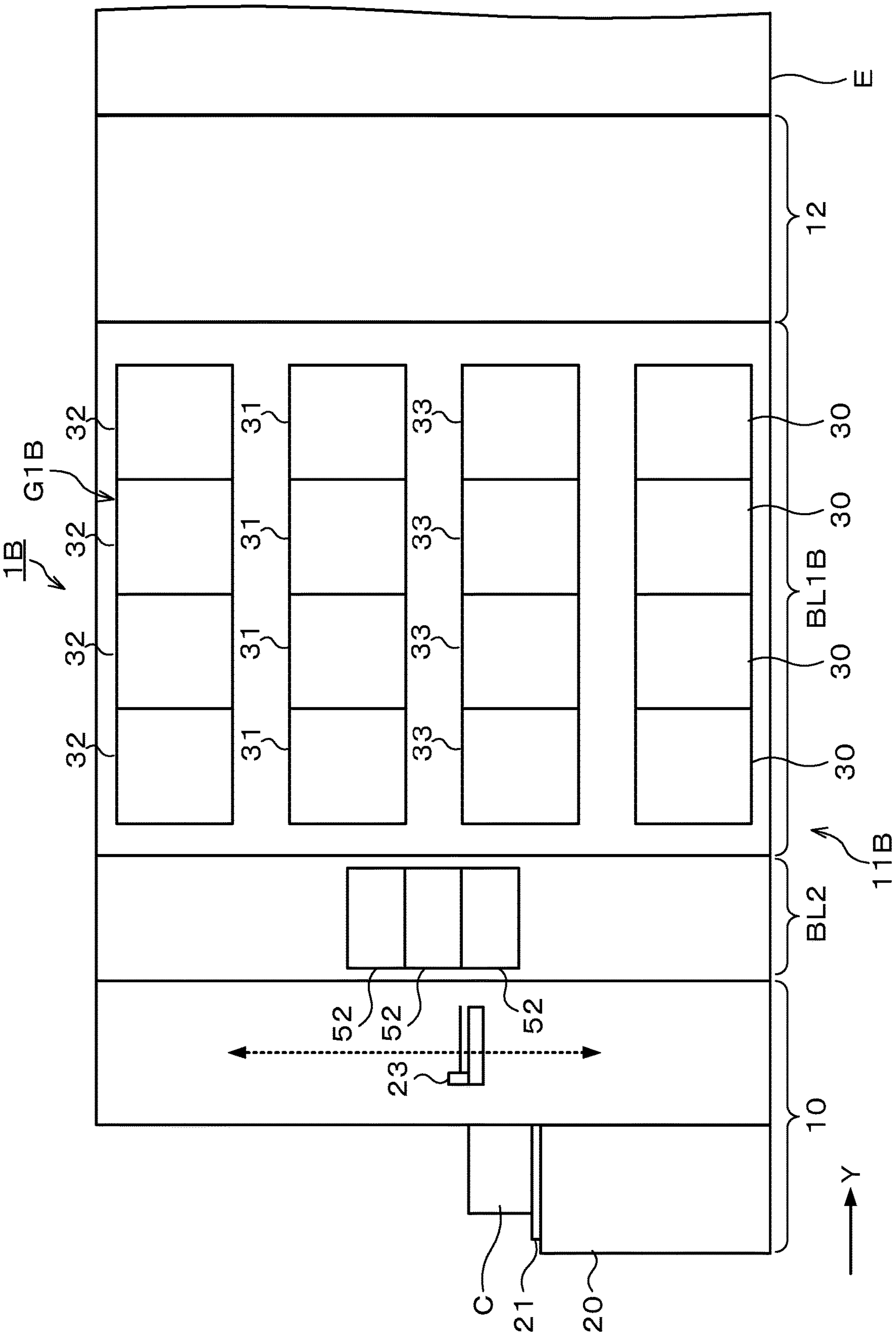
FIG. 10 is a view illustrating the outline of an internal configuration on the front side of a wafer treatment apparatus as a substrate treatment apparatus according to a third embodiment.

FIG. 10 is a view illustrating the outline of an internal configuration on the front side of a wafer treatment apparatus as a substrate treatment apparatus according to a third embodiment.

According to the experiments carried out by the present inventors, the occurrence rate of the pattern collapse was lower in the case of supplying water or ozone water to the base film before the formation of the inorganic resist film (specifically, a tin-containing resist film) than in the case of not supplying water or ozone water.

This can be considered because OH groups increased on the surface of the base film due to the supply of water or ozone water, namely, the hydrophilic property of the surface of the base film increased, resulting in that a lower part of the protrusion of pattern of the inorganic resist became wide to improve the adhesiveness between the pattern of the inorganic resist and the base film.

A wafer treatment apparatus 1B in FIG. 10 is made based on the above result of the experiments, and includes a hydrophilization module 33 in addition to the configuration of the wafer treatment apparatus 1 illustrated in FIG. 1 and so on. The hydrophilization module 33 supplies a solution for hydrophilizing the base film (hereinafter, a hydrophilizing solution) as the treatment solution to the wafer W. The hydrophilizing solution is, for example, water or ozone water.

A plurality of the hydrophilization modules 33 are provided to line up in the width direction (Y-direction in the drawing) as with the developing modules 30 or the like, in a first block G1B of a treatment block BL1B of a treatment station 11B. The number and the arrangement of the hydrophilization modules 33 can be arbitrarily selected.

Further, in the hydrophilization module 33, the hydrophilizing solution is applied onto the wafer W, for example, by the spin coating method as in the developing module 30 or the like.

Further, the configuration of the hydrophilization module 33 is the same as the configuration of the developing module 30. However, the number of the discharge nozzles which discharge the treatment solution and the treatment solution supplied from the discharge nozzles are different between the hydrophilization module 33 and the developing module 30.

<Example of the Treatments by the Wafer Treatment Apparatus 1B>

Figure 11:
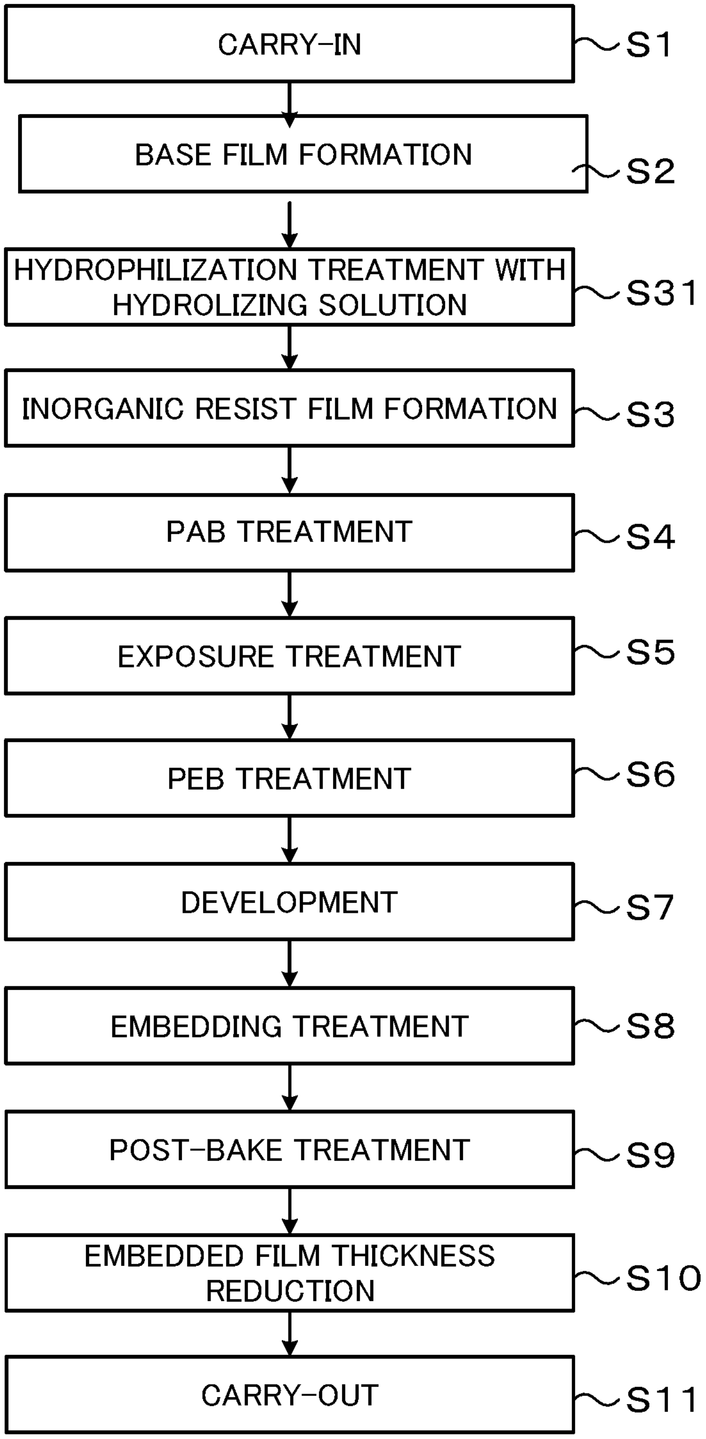
FIG. 11 is a flowchart illustrating main processes of an example of the treatments by the wafer treatment apparatus in FIG. 10.

FIG. 11 is a flowchart illustrating main processes of the example of the treatments by the wafer treatment apparatus 1B.

In the treatments by the wafer treatment apparatus 1B, for example, treatments up to the base film formation process at Step S2 in the treatments by the wafer treatment apparatus 1 are performed as illustrated in FIG. 11, and then the hydrophilization treatment of the base film with the hydrophilizing solution is performed.

Specifically, the wafer W is carried by the carrier module R2 to the hydrophilization modules 33, and the hydrophilizing solution is supplied to the surface of the rotating wafer W. Thus, the entire surface of the base film on the wafer W is hydrophilized by OH radicals in the hydrophilizing solution. In other words, the OH radicals in the hydrophilizing solution increase the OH groups on the entire surface of the base film on the wafer W.

Thereafter, Step S3 and subsequent steps in the treatments by the wafer treatment apparatus 1 are performed.

<Main Effects of the Third Embodiment>

In this embodiment, the hydrophilizing solution such as water or ozone water is supplied to the base film before the inorganic resist film is formed on the base film, so that it is possible to hydrophilize the surface of the base film on the wafer W as explained above. Therefore, it is possible to make a lower part of the protrusion of the pattern wide when the pattern of the resist is formed on the base film. Accordingly, it is possible to improve the adhesiveness between the pattern of the resist and the base film.

(Modification Example of the Third Embodiment)

In the above, the ozone water as the hydrophilizing water is supplied to the base film to expose the base film to an ozone atmosphere. The technique of exposing the base film to the ozone atmosphere is not limited to the above, but may be, for example, a method of supplying gas containing ozone to the base film, specifically, a method of spraying gas containing ozone to the base film from a two-fluid nozzle.

Further, the hydrophilization module 33 and the resist coating module 32 are configured to be separate modules in the above, but may be integrated into the same module. In this case, the integrated module preferably has a hybrid cup capable of individually collecting the hydrophilizing water and the resist solution.

Fourth Embodiment

Figure 12:
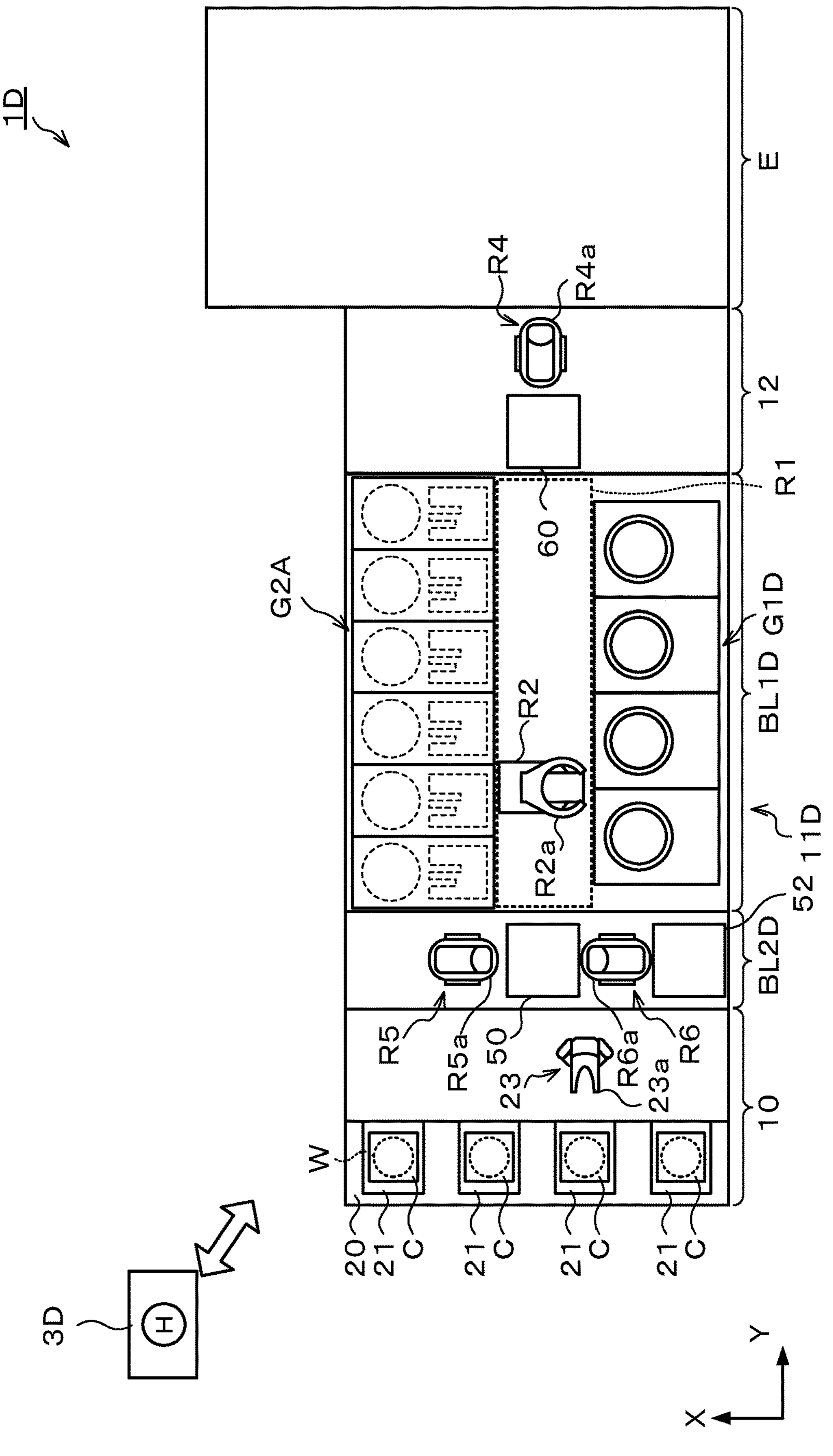
FIG. 12 is an explanatory view illustrating the outline of an internal configuration of a wafer treatment apparatus as a substrate treatment apparatus according to a fourth embodiment.
Figure 13:
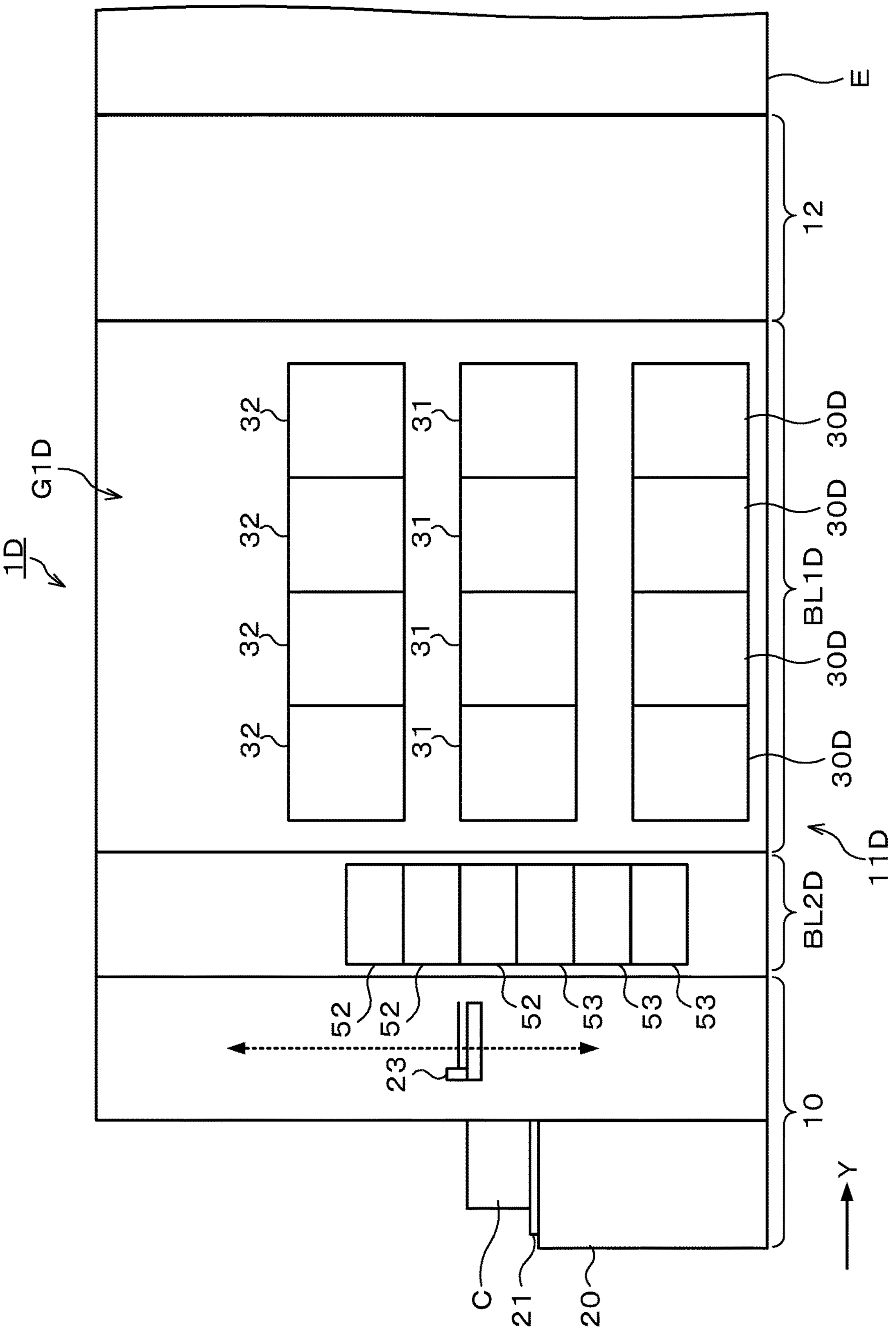
FIG. 13 is a view illustrating the outline of the internal configuration on the front side of the wafer treatment apparatus in FIG. 12.

FIG. 12 is an explanatory view illustrating the outline of an internal configuration of a wafer treatment apparatus as a substrate treatment apparatus according to a fourth embodiment. FIG. 13 is a view illustrating the outline of the internal configuration on the front side of the wafer treatment apparatus in FIG. 12.

A wafer treatment apparatus 1D in FIG. 12 and FIG. 13 and the wafer treatment apparatus 1 in FIG. 1 to FIG. 3 are different in the following points.

- Point that the wafer treatment apparatus 1D has the second block G2A including the UV irradiation module 41 as with the wafer treatment apparatus 1B in FIG. 8.
- Point that the wafer treatment apparatus 1D has a measurement module 53.
- Point that the developing module 30D in the wafer treatment apparatus 1D has a plurality of types of developing solution nozzles different from one another in the form of use at the discharge of the developing solution, and is configured to switch the developing solution to be discharged from among a plurality of types of developing solutions different from one another in solubility of the inorganic-containing resist.
- Point that a program storage of a controller 3D in the wafer treatment apparatus 1D further stores a program including an instruction for a later-explained decision sequence relating to the pattern collapse.

The measurement module 53 measures the state of the pattern of the inorganic resist formed by the wafer treatment apparatus 1D. Specifically, the measurement module 53 measures the state of the pattern of the inorganic resist after the thickness of the embedded film is reduced by the UV irradiation module 52, under the atmospheric gas atmosphere. The measurement by the measurement module 53 is performed, for example, using the Scatterometry.

The measurement result by the measurement module 53 is output to the controller 3D.

The measurement module 53 is provided, for example, in a delivery block BL2D in the treatment station 11D. Specifically, a plurality of the measurement modules 53 are provided, for example, in a manner to be stacked in the vertical direction with the UV irradiation modules 52 as illustrated in FIG. 13.

<Example of a Decision Sequence Relating to the Pattern Collapse by the Wafer Treatment Apparatus 1D>

Figure 14:
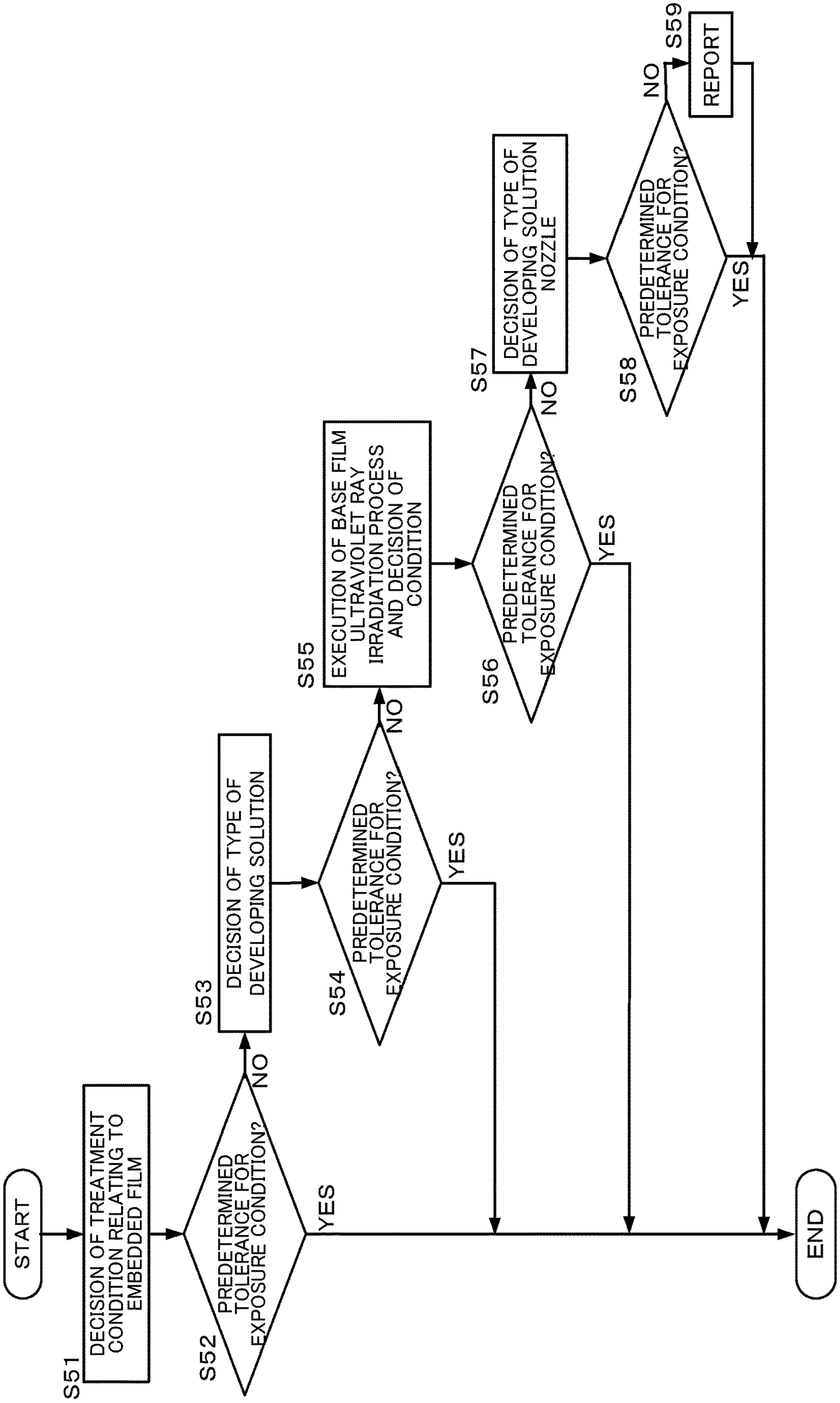
FIG. 14 is a flowchart illustrating an example of a decision sequence relating to pattern collapse by the wafer treatment apparatus in FIG. 12.

FIG. 14 is a flowchart illustrating an example of the decision sequence relating to the pattern collapse (including the peeling of the pattern) by the wafer treatment apparatus 1D.

In the decision sequence by the wafer treatment apparatus 1D, the decision relating to the pattern collapse of the inorganic resist including the decision of a treatment condition relating to the embedded film is performed.

In the decision sequence by the wafer treatment apparatus 1D, for example, the treatment condition relating to the embedded film is decided first as illustrated in FIG. 14 (Step S51). Specifically, for a wafer W for conditioning, the same treatments as those by the wafer treatment apparatus 1 including the embedding treatment process at Step S8 explained using FIG. 6 are performed to form a pattern of the metal-containing resist. Further, the state of the formed pattern of the metal-containing resist is measured, and the treatment condition relating to the embedded film is decided based on the measurement result. The treatment condition relating to the embedded film is, for example, a drying condition of the embedding solution in the embedding treatment process at Step S8. In the case where the type or the concentration of the embedding solution can be changed in the developing module 30D, the treatment condition relating to the embedded film may be the type or the concentration of the embedding solution.

At Step S51, more specifically, for example, the processes at Step S1 to Step S11 in FIG. 6 are first performed on the wafer W for conditioning. In this event, in the exposure treatment at Step S5, the exposure is performed as follows. Specifically, when each region when the surface of the wafer W is partitioned into a plurality of regions is regarded a divided exposure region, the exposure is performed under an exposure condition (specifically, focus and exposure amount) different for each of the divided exposure region. Further, in this event, for the treatment condition in the embedding treatment process at Step S8, the one selected from pre-stored candidates is used. Further, in this event, after the embedded film thickness reducing process at Step S10 and before the carry-out at Step S11, the state of the pattern of the inorganic resist is measured using the Scatterometry by the measurement module 53 for each of the divided exposure regions.

Next, the controller 3D determines whether a defect of the pattern collapse has occurred, based on the measurement result using the Scatterometry by the measurement module 53 for each of the divided exposure regions.

Specifically, the controller 3D calculates goodness of fit (GOF) between the measurement result using the Scatterometry by the measurement module 53 and the pre-stored model corresponding to a target pattern dimension for each of the divided exposure regions. The controller 3D then determines that the defect of the pattern collapse has occurred for a divided exposure region where the goodness of fit is less than a predetermined threshold value, and determines that the defect of the pattern collapse has not occurred for a divided exposure region where the goodness of fit is equal to or more than the predetermined threshold value.

Then, if the number of the divided regions where the defect of the pattern collapse has not occurred is equal to or more than the predetermined threshold value, namely, if a predetermined tolerance can be secured for the exposure condition for forming the pattern of the inorganic-containing resist in a desired state, the candidate of the treatment condition used in the embedding treatment process at Step S8 for the wafer for conditioning is decided as the treatment condition of the same process for an actual wafer W.

On the other hand, if the number of the divided regions where the defect of the pattern collapse has not occurred is less than the predetermine threshold value, namely, if the predetermined tolerance cannot be secured for the exposure condition for forming the pattern of the inorganic-containing resist in the desired state, the above processes are repeated until the predetermined tolerance can be secured. However, the treatment condition used at the embedding treatment process at Step S8 is changed to another pre-stored candidate every repetition.

Note that there is a case where none of the pre-stored candidates of the treatment condition used in the embedding treatment process at Step S8 makes the number of the divided regions where the defect of the pattern collapse has not occurred equal to or more than the predetermined threshold value. In other words, there is a case where the predetermined tolerance cannot be secured for the exposure condition for forming the pattern of the inorganic-containing resist in the desired state (a case of NO at Step S52 in FIG. 14), in a range that the treatment condition in the embedding treatment process at Step S8 is previously set. In this case, the type of the developing solution is further decided (Step S53).

Specifically, the same treatments by the wafer treatment apparatus 1 including the embedding treatment process at Step S8 explained using FIG. 6 are performed for the wafer W for conditioning to form the pattern of the metal-containing resist. Further, the state of the formed pattern of the metal-containing resist is measured, and the type of the developing solution is decided based on the measurement result.

At Step S53, more specifically, for example, the processes at Step S1 to Step S11 in FIG. 6 and the measurement by the measurement module 53 are first performed as at Step S51, for the wafer for conditioning. In this event, the type of the developing solution to be used in the developing process at Step S7 is selected from among the pre-stored candidates. Further, in this event, the embedding treatment process at Step S8 may be performed based on a candidate with the highest goodness of fit at Step S51 among the pre-stored candidates of the treatment condition.

Next, the controller 3D determines whether a defect of the pattern collapse has occurred, based on the measurement result using the Scatterometry by the measurement module 53 for each of the divided exposure regions as at Step S51.

Then, if the number of the divided regions where the defect of the pattern collapse has not occurred is equal to or more than the predetermined threshold value, the type of the used developing solution is decided as the type of the developing solution to be used for an actual wafer W.

On the other hand, if the number of the divided regions where the defect of the pattern collapse has not occurred is less than the predetermine threshold value, namely, if the predetermined tolerance cannot be secured for the exposure condition for forming the pattern of the inorganic-containing resist in the desired state, the above processes are repeated until the predetermined tolerance can be secured. However, the type of the developing solution to be used at Step S7 is changed to another pre-stored type every repetition. In this event, the type of the developing solution to be used in the developing process at Step S7 may be changed according to the aforementioned goodness of fit. Specifically, if the goodness of fit is slightly small and the defect of the pattern collapse exists, the type of the developing solution may be changed to a type of a developing solution with a smaller hydrogen bonding term of the Hansen solubility parameter proportional to the solubility of a negative inorganic resist, and if the goodness of fit is very small and there are many defects of the pattern collapse, the type of the developing solution may be changed to a type of a developing solution with a much smaller hydrogen bonding term. The hydrogen bonding term of the Hansen solubility parameter is associated with the type of the developing solution and stored in advance in the storage (not illustrated).

Note that there is a case where none of the pre-stored types of the developing solution makes the number of the divided regions where the defect of the pattern collapse has not occurred equal to or more than the predetermined threshold value. In other words, there is a case where the predetermined tolerance cannot be secured (a case of NO at Step S54 in FIG. 14) for the exposure condition for forming the pattern of the inorganic-containing resist in the desired state among the types set in advance for the developing solution. In this case, the ultraviolet irradiation process for the base film is decided to be performed after the base film formation process until the resist film formation process as in the treatments explained using FIG. 9, and the treatment condition in the ultraviolet irradiation process is further decided (Step S55). The treatment condition decided here may be, for example, an exposure amount per unit time or an exposure time in the ultraviolet irradiation process.

At Step S55, specifically, for example, the processes at Step S1 to Step S11 in FIG. 6 and the measurement by the measurement module 53 are first performed as at Step S53, and Step S21 in FIG. 9 is performed between Step S2 and Step S3 for the wafer for conditioning. In this event, the ultraviolet irradiation process at Step S21 is performed based on the pre-stored candidate selected from among the candidates of the treatment condition. Further, the type of the developing solution to be used in this event may be the one with the highest goodness of fit at Step S53 among the pre-stored candidates of the type of the developing solution.

Next, the controller 3D determines whether a defect of the pattern collapse has occurred, based on the measurement result using the Scatterometry by the measurement module 53 for each of the divided exposure regions.

Then, if the number of the divided regions where the defect of the pattern collapse has not occurred is equal to or more than the predetermined threshold value, the candidate of the treatment condition used in the ultraviolet irradiation process at Step S21 for the wafer for conditioning is decided as the treatment condition of the same process for an actual wafer W.

On the other hand, if the number of the divided regions where the defect of the pattern collapse has not occurred is less than the predetermine threshold value, namely, if the predetermined tolerance cannot be secured for the exposure condition for forming the pattern of the inorganic-containing resist in the desired state, the above processes are repeated until the predetermined tolerance can be secured. However, the treatment condition used in the ultraviolet irradiation process at Step S21 is changed to another pre-stored candidate every repetition.

Note that there is a case where none of the pre-stored candidates of the treatment condition to be used in the ultraviolet irradiation process at Step S21 makes the number of the divided regions where the defect of the pattern collapse has not occurred equal to or more than the predetermined threshold value. In other words, there is a case where the predetermined tolerance cannot be secured (a case of NO at Step S56 in FIG. 14) for the exposure condition for forming the pattern of the inorganic-containing resist in the desired state, in a range previously set for the treatment condition in the ultraviolet irradiation process at Step S21. In this case, the type of the developing solution nozzle is further decided (Step S57). The developing solution nozzle differs in supply form of the developing solution depending on its type and therefore the impact of the supplied developing solution on the pattern of the inorganic resist differs for each nozzle, so that the change of the type of the developing solution nozzle can suppress the pattern collapse.

At Step S57, specifically, for example, the processes at Step S1 to Step S11 in FIG. 6 and the measurement by the measurement module 53 are first performed as at Step S55, and Step S21 in FIG. 9 is performed between Step S2 and Step S3 for the wafer for conditioning. In this event, the nozzle of the developing solution to be used in the developing process at Step S7 is selected from among the pre-stored candidates. Further, in this event, the ultraviolet irradiation process at S21 may be performs based on a candidate with the highest goodness of fit at Step S55 among the pre-stored candidates of the treatment condition.

Next, the controller 3D determines whether a defect of the pattern collapse has occurred, based on the measurement result using the Scatterometry by the measurement module 53 for each of the divided exposure regions as at Step S51.

Then, if the number of the divided regions where the defect of the pattern collapse has not occurred is equal to or more than the predetermined threshold value, the type of the used developing solution nozzle is decided as the type of the developing solution nozzle to be used for an actual wafer W.

On the other hand, if the number of the divided regions where the defect of the pattern collapse has not occurred is less than the predetermine threshold value, namely, if the predetermined tolerance cannot be secured for the exposure condition for forming the pattern of the inorganic-containing resist in the desired state, the above processes are repeated until the predetermined tolerance can be secured. However, the type of the developing solution nozzle to be used at Step S7 is changed to another pre-stored type every repetition.

Next, the controller 3D determines whether a defect of the pattern collapse has occurred, based on the measurement result using the Scatterometry by the measurement module 53 for each of the divided exposure regions as at Step S51.

Then, if the number of the divided regions where the defect of the pattern collapse has not occurred is equal to or more than the predetermined threshold value, the candidate of the type of the developing solution nozzle used for the wafer for conditioning is decided as the type of the developing solution nozzle to be used for an actual wafer W.

On the other hand, if the number of the divided regions where the defect of the pattern collapse has not occurred is less than the predetermine threshold value, namely, if the predetermined tolerance cannot be secured for the exposure condition for forming the pattern of the inorganic-containing resist in the desired state, the above processes are repeated until the predetermined tolerance can be secured. However, the type of the developing solution nozzle to be used at Step S7 is changed to another pre-stored type every repetition.

Note that there is a case where none of the pre-stored types of the developing solution nozzle makes the number of the divided regions where the defect of the pattern collapse has not occurred equal to or more than the predetermined threshold value. In other words, there is a case where the predetermined tolerance cannot be secured (a case of NO at Step S58 in FIG. 14) for the exposure condition for forming the pattern of the inorganic-containing resist in the desired state among types previously set for the developing solution nozzle. In this case, for example, it is reported that the decision sequence relating to the pattern collapse by the wafer treatment apparatus 1D cannot be completed (Step S59). This report is performed via a display device such as a liquid crystal display.

If the decision sequence relating to the pattern collapse by the wafer treatment apparatus 1D has been completed, an actual wafer W is treated based on the treatment condition decided by the decision sequence.

(Modification Example of the Fourth Embodiment)

In the above, the "desired state" in the "pattern of the inorganic-containing resist in the desired state" means a state where the defect of the pattern collapse has not occurred. The above "desired state" may mean the state where the defect of the pattern collapse has not occurred and which satisfies at least one of a state having a desired line width or a state of the pattern of the inorganic-containing resist being appropriately removed by a removal treatment.

Note that the line width of the pattern of the inorganic-containing resist is calculated by the controller 3D based on the measurement result by the measurement module 53.

Further, whether the pattern of the inorganic-containing resist is in a state of being appropriately removed by a removal treatment is determined as follows. Specifically, the removal treatment of the pattern of the inorganic-containing resist is performed in an etching apparatus outside the wafer treatment apparatus 1D, then the state of the wafer W is measured by a measurement apparatus outside the wafer treatment apparatus 1D, and the measurement result is output to the controller 3D. Then, the controller 3D determines whether the pattern of the inorganic-containing resist is in a state of being appropriately removed by a removal treatment based on the measurement result.

Besides, though mutually different types of the developing solution nozzles are provided in each of the developing modules 30D in the above example, different types of the developing solution nozzles may be provided in mutually different developing modules.

The treatment condition relating to the embedded film decided in the fourth embodiment is the treatment condition in the developing process at Step S8 in the above example, but may be a treatment condition (for example, the temperature, heating time, or the like of the wafer W) at the post-bake treatment process at Step S9 or a treatment condition (for example, the temperature, heating time, or the like of the wafer W) in the PEB treatment process at Step S6.

A part of the controller 3D which makes decision relating to at least the pattern collapse may be provided in a control device which collectively controls a plurality of wafer treatment apparatuses of the same type as the wafer treatment apparatus 1D.

Fifth Embodiment

Figure 15:
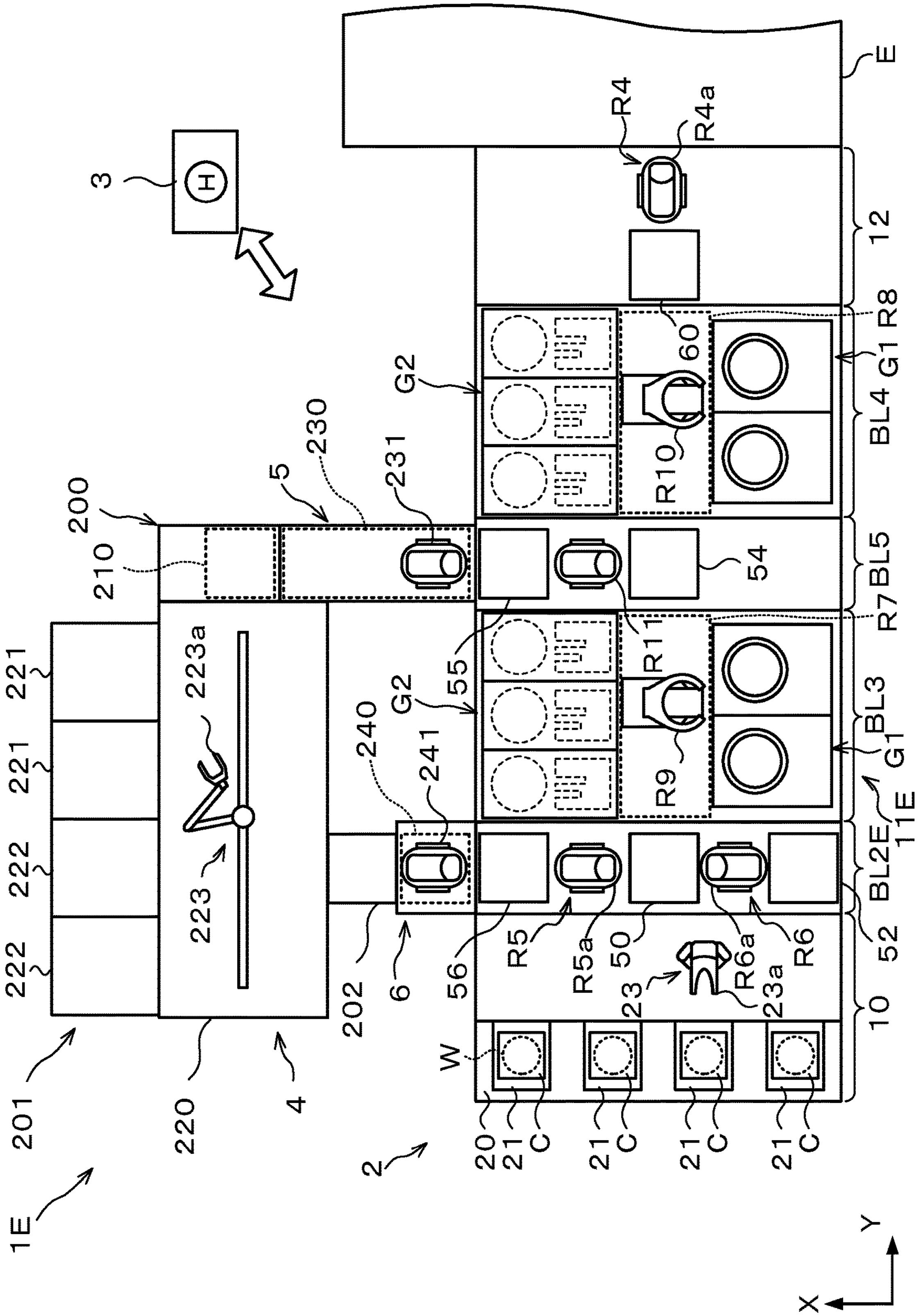
FIG. 15 is an explanatory view illustrating the outline of an internal configuration of a wafer treatment apparatus as a substrate treatment apparatus according to a fifth embodiment.

FIG. 15 is an explanatory view illustrating the outline of an internal configuration of a wafer treatment apparatus as a substrate treatment apparatus according to a fifth embodiment.

A wafer treatment apparatus 1E in FIG. 15 has a wet treatment section 2, a dry treatment section 4, a first relay carrier section 5, and a second relay carrier section 6.

The wet treatment section 2 includes a cassette station 10, a treatment station 11E, and an interface station 12. The number of the treatment blocks BL1 in the treatment station 11 in the above wafer treatment apparatus 1 is one. Contrarily, in the wafer treatment apparatus 1E in FIG. 15, a plurality of (two in the example of the drawing) treatment blocks BL3, BL4 are provided across a relay block BL5 along the width direction (Y-direction in the drawing) in the treatment station 11E. The treatment block BL3 is located on the cassette station 10 side, and the relay block BL4 is located on the interface station 12 side.

Each of the treatment blocks BL3, BL4 is configured almost the same as the treatment block BL1 illustrated in FIG. 1 and so on. Specifically, each of the treatment blocks BL3, BL4 has a first block G1, for example, on the front side (X-direction negative side in the drawing). For example, in the first block G1, a plurality of developing modules 30, base film forming modules 31, and resist coating modules 32 are arranged to line up along the width direction (Y-direction in the drawing). Further, each of the treatment blocks BL3, BL4 has a second block G2, for example, on the deep side (X-direction positive side in the drawing). In the second block G2, for example, a plurality of thermal treatment modules 40 are provided to line up in the vertical direction and the width direction (Y-direction in the drawing).

Note that the number of the developing modules 30 arranged to line up in the width direction may be different or the same between the treatment block BL3 and the treatment block BL4. This also applies to the base film forming module 31, the resist coating module 32, and the thermal treatment module 40.

Further, in the treatment blocks BL3, BL4, carry regions R7, R8 extending in the width direction are provided at portions between the first block G1 and the second block G2 and them, respectively. In the carry regions R7, R8, carrier modules R9, R10 which carry the wafer W are arranged, respectively.

The carrier module R9 can carry the wafer W to the solution treatment module, the thermal treatment module 40, the delivery module 51 in the delivery tower 50, and the delivery module in a later-explained delivery tower 54 therearound. The carrier module R10 can carry the wafer W to the solution treatment module, the thermal treatment module 40, the delivery module in the later-explained delivery tower 54, and a delivery module 61 in a later-explained delivery tower 60 therearound.

In the relay block BL5, the delivery tower 54 is provided at a middle portion in the depth direction (X-direction in the drawing). In the delivery tower 54, a plurality of delivery modules (not illustrated) are provided in a manner to be stacked in the vertical direction. On the deep side (X-direction positive side in the drawing) of the delivery tower 54, a carrier module R11 is provided. The carrier module R11 carries the wafer W between the plurality of delivery modules in the delivery tower 54 and a later-explained delivery module 55.

In this example, the delivery module 55 for delivery between the first relay carrier section 5 and the wet treatment section 2 is provided on the deep side (X-direction positive side in the drawing) of the carrier module R11.

Further, in this example, a delivery module 56 for delivery between the second relay carrier section 6 and the wet treatment section 2 is provided on the deep side (X-direction positive side in the drawing) of the first relay carrier section 5. In this example, the carrier module R5 can carry the wafer W between the plurality of delivery modules 51 in the delivery tower 50 and the delivery module 56.

The dry treatment section 4 has a load lock station 200, a treatment station 201, and a load lock module 202.

In the load lock station 200, a load lock module 210 is provided. Each of the load lock modules 210, 202 is configured to switch the inside atmosphere between a reduced-pressure atmosphere and the atmospheric-pressure atmosphere.

The treatment station 201 has a vacuum carrier chamber 220, a treatment module 221, and a thermal treatment module 222.

The vacuum carrier chamber 220 is composed of a housing configured to be sealable, and its inside is kept in a reduced-pressure state (vacuum state).

The treatment module 221 is a dry treatment module, and performs in a dry mode the wafer treatment of the same type as that by the wet treatment module in the wet treatment section 2, specifically, performs in the dry mode the developing treatment to be performed by the developing module 30 in the wet treatment section 2. The dry mode is a mode using gas, specifically, a mode using gas under a reduced pressure. It can also be said that the dry treatment is intended to obtain an action that is the purpose of the treatment mainly with gas, and the wet treatment is intended to obtain the action mainly with liquid.

The thermal treatment module 222 performs a post-bake treatment as the heat treatment on the wafer W after the developing treatment in the dry mode.

Further, in the vacuum carrier chamber 220, a carrier module 223 which carries the wafer W is provided. The carrier module 223 has a carrier arm 223*a* which is movable, for example, in the width direction (Y-direction in the drawing) and the direction around the vertical axis. The carrier module 223 can carry the wafer W among the treatment module 221, the thermal treatment module 222, and the load lock modules 210, 202, while holding the wafer W on the carrier arm 223*a*.

Each of the first relay carrier section 5 and the second relay carrier section 6 carries the wafer W between the wet treatment section 2 and the dry treatment section 4.

The first relay carrier section 5 has a carrier path 230 at a position adjacent to the relay block BL5 in the depth direction (X-direction in the drawing). In the carrier path 230, a carrier module 231 is provided. The carrier module 231 carries the wafer W between the delivery module 55 and the load lock module 210.

The second relay carrier section 6 has a carrier path 240 at a position adjacent to a delivery block BL2E in the depth direction (X-direction in the drawing). In the carrier path 240, a carrier module 241 is provided. The carrier module 241 carries the wafer W between the delivery module 56 and the load lock module 202.

<Example of the Treatments by the Wafer Treatment Apparatus 1E>

Next, an example of the treatments by the wafer treatment apparatus 1E will be explained.

In the one example of the treatments by the wafer treatment apparatus 1E, for example, the processes at Step S1 to Step S8 in FIG. 6 are first performed. Thus, for example, a pattern of the inorganic resist larger than a target line width is formed on the wafer W and the embedded film is formed.

Next, the thermal treatment module 40 performs the PEB treatment for the second time. This promotes the cross-linking of the pattern of the inorganic resist to harden the pattern of the inorganic resist.

Subsequently, Step S10 in FIG. 6 is performed, at which the UV irradiation module 52 removes the embedded film.

Thereafter, the treatment module 221 in the dry treatment section 4 performs an additional developing treatment in the dry mode to reduce the line width of the pattern of the inorganic resist, thereby forming a pattern of the inorganic resist having the target line width.

(Modification Example of the Fifth Embodiment)

The UV irradiation module 52 may be provided in the relay block BL5 in place of or in addition to the delivery block BL2E.

Other Modification Examples

Though all the embedded film is removed when reducing the thickness of the embedded film in the above example, the embedded film may be left at a bottom between adjacent protrusions of the pattern of the inorganic resist. For example, the embedded film may be left up to 10% or more of the height of the protrusion of the pattern of the inorganic resist.

In this case, the embedded film F left between the protrusions RP1 is removed together with the base film U at the time of etching the base film U using etching gas using the pattern of the inorganic resist as a mask. The embedded film F is preferably lower in etching resistance than the base film U with respect to general etching gas, as the base film U.

Leaving a part of the embedded film as above can suppress the collapse of the pattern of the inorganic resist until the etching of the base film U.

Further, in this case, the amount by which the thickness of the embedded film F is reduced may be decided as the treatment condition relating to the embedded film when deciding the treatment condition relating to the embedded film in the fourth embodiment.

Though the developer that develops the wafer W and the embedder that performs the embedding treatment on the wafer W are united in one module in the above example, they may individually constitute separate modules.

Further, the UV irradiation module 52 for removing the embedded film may irradiate the wafer W with ultraviolet ray while heating the wafer W. In this case, the UV irradiation module 52 has a hot plate (not illustrated) on which the wafer W is to be mounted as in the thermal treatment module 40. The UV irradiation module 52 and the thermal treatment module 40 may be integrated into the same module. In this case, a module which performs both of a heat treatment performed immediately before the ultraviolet irradiation treatment (the post-bake treatment in the example in FIG. 6 or the PEB treatment for the second time in the fifth embodiment) and the ultraviolet irradiation treatment, may sequentially perform the heat treatment immediately before the ultraviolet irradiation treatment and the ultraviolet irradiation treatment. Specifically, the above module may complete the heat treatment immediately before the ultraviolet irradiation treatment, and then radiate the ultraviolet ray toward the wafer W on the hot plate while continuing the heating of the wafer W by the hot plate.

In the above example, the state of the pattern of the inorganic resist is measured using the Scatterometry. Instead of this, the surface of the pattern of the inorganic resist may be imaged by an imaging module, and the state of the pattern of the inorganic resist may be detected/measured based on the imaging result.

According to repeated experiments by the present inventors, when the hydrogen bonding term of the Hansen solubility parameter of the treatment solution is large, the solubility of a negative inorganic resist with respect to the treatment solution is higher as compared with the case where the hydrogen bonding term is small, namely, a polar treatment solution is higher in solubility than a non-polar treatment solution. This can be considered because when the negative inorganic resist is exposed, a component having a hydroxyl group in the resist generated due to removal of a ligand is more soluble in the treatment solution having a small hydrogen bonding term of the Hansen solubility parameter, namely, is more soluble in a treatment solution with high polarity.

Further, according to repeated experiments by the present inventors, when the hydrogen bonding term of the Hansen solubility parameter of the treatment solution used for development is small, the collapse (including the peeling) of the pattern of the negative inorganic resist is less likely to occur as compared with case where the hydrogen bonding term is large, namely, the collapse is less likely to occur when the treatment solution used for development is non-polar than when the treatment solution is polar. The conceivable reason is as follows.

In the negative inorganic resist film after the pattern exposure, there are an unexposed region where the exposure amount is zero (or close to zero), an exposed region where the exposure amount is enough, and an intermediately exposed region where the exposure amount is lower than that in the exposed region at a position between the unexposed region and the exposed region. In the intermediately exposed region, the exposure amount on the deep side far from the film surface is smaller than the exposure amount on the film surface side because of the property of the exposure light (specifically, EUV light). Therefore, in the intermediately exposed region, the condensation reaction amount of the negative inorganic resist is small and the degree of solidification is also low, on the deep side far from the film surface.

Accordingly, when using the polar treatment solution high in solubility of the negative inorganic resist for the development, more resist is removed on the deep side of the intermediately exposed region of the negative inorganic resist than on the film surface side, so that the root of the resist pattern becomes thin. As a result of this, it is considered that the collapse or peeling of the pattern is likely to occur.

On the other hand, when using the non-polar treatment solution low in solubility of the negative inorganic resist for the development, there is almost no difference in removal amount of the resist between the deep side and the film surface side in the intermediately exposed region of the negative inorganic resist, so that the root of the resist pattern is less likely to become thin. As a result of this, it is considered that the collapse or peeling of the pattern is less likely to occur.

However, in the case where the treatment solution used for development is non-polar, the solubility of the negative inorganic resist with respect to the treatment solution is low, so that there is a possibility that the inorganic resist to be removed by development cannot be entirely removed, namely, there is a possibility that a residue or a bridge defect may occur.

In light of these, a polar treatment solution being a component of improving the solubility of the inorganic resist with respect to the embedding solution, namely, a polar solvent may be contained as a sub-component, in the embedding solution. Specifically, an organic polymer solution having a non-polar organic solvent as the solvent may be used as a main component of the embedding solution, and a polar treatment solution may be used as a sub-component of the embedding solution.

Thus, in the case of using the non-polar treatment solution as the developing solution for suppressing the collapse or the like of the pattern, it is possible to cause the inorganic resist, which may remain due to the use of the non-polar treatment solution, to solve in the embedding solution at embedding. Accordingly, it is possible to suppress the collapse and the peeling of the pattern while suppressing the occurrence of the residue and the bridge. Note that the inorganic resist solved in the embedding solution is removed together with the embedded film which has been formed by drying the embedding solution, at the removal of the embedded film.

Examples of the polar treatment solution contained as the sub-component in the embedding solution include N-propanol, acetic acid, water, ethyl lactate, acetone, and a mixed solution of two or more of them.

If the main component (specifically, organic polymer solution) of the embedding solution and the polar treatment solution do not mix together, a dispersing agent may further be contained as the sub-component of the embedding solution.

The dispersing agent of the embedding solution contains, as a solvent, for example, isopropyl alcohol, ethanol, normal propyl alcohol (NPA), methyl isobutyl carbinol (MIBC), propylene glycol monomethyl ether (PGME), cyclohexane, or a mixed solution of two or more of them. Further, the dispersing agent contains, as a surfactant, for example, a nonionic one, specifically, solbitan monooleate, Glycerol α-monooleate, polyethylene glycol sorbitan fatty acid ester, polyethylene glycol linear alkyl ether, linear alkyl addition type polyethylene glycol phenyl ether, branched chain alkyl addition type polyethylene glycol phenyl ether, acetylene glycol, or a combination of them. The dispersing agent of the embedding solution may contain, as the surfactant, an anionic one, specifically, may contain sodium laurate, sodium stearate, sodium oleate, sodium dodecyl sulfate, sodium dodecylbenzenesulfonate, or a combination of them.

Further, for example, the percentage of the main component in the embedding solution is 80% to 95%, and the percentage of the sub-component (the polar treatment solution alone or a total of the polar treatment solution and the dispersing agent) in the embedding solution is 5% to 15%.

Note that for the solvent of the organic polymer solution being the main component in the embedding solution, for example, PGMEA is used. The percentage of PGMEA being the solvent of the organic polymer solution in the embedding solution is 80% to 90%, and the percentage of the organic polymer in the embedding solution is about 5%.

The developing solution used together with the embedding solution containing the polar treatment solution as the sub-component is the one exhibiting the non-polarity, specifically, the one having a hydrogen bonding term of the Hansen solubility parameter of 10 $MPa^{1/2}$ or less, and more specifically, PGMEA, 2-heptanone, cyclohexane, normal butyl alcohol, acetone, or a mixed solution of two or more of them.

Further, according to repeated experiments by the present inventors, it has been found that when water was added to the non-polar developing solution, the collapse and the peeling of the pattern of the inorganic resist became less likely to occur.

In light of the experiment result, water may be added to the non-polar developing solution used together with the embedding solution containing the polar treatment solution as the sub-component. In other words, a mixed solution of the non-polar treatment solution as the main component and water as the sub-component may be used as the developing solution. Besides, in the case where the non-polar treatment solution as the main component of the developing solution and water as the sub-component of the developing solution do not mix together, the dispersing agent may further be contained as the sub-component of the developing solution.

In the case where the developing solution is the mixed solution containing water as above, for example, the percentage of the sub-component (water alone or a total of water and the dispersing agent) in the developing solution is set to, for example, 20% or less, specifically, 10% or more and 20% or less so that the developing solution does not exhibit high polarity, namely, the solubility of the inorganic resist with respect to the developing solution does no become high. Further, the percentage of water in the developing solution or the like may be decided so that the hydrogen bonding term of the Hansen solubility parameter of the developing solution being the mixed solution with water becomes 11 $MPa^{1/2}$ or less.

Further, in the case where the developing solution is the mixed solution containing water, for example, the non-polar treatment solution having a hydrogen bonding term of the Hansen solubility parameter of 10 $MPa^{1/2}$ or less is used for the non-polar treatment solution as the main component of the developing solution, specifically, PGMEA, 2-heptanone, cyclohexane, normal butyl alcohol, acetone, or a mixed solution of two or more of them is used.

Further, the dispersing agent contained as the sub-component in the developing solution uses, as the solvent, for example, the same non-polar treatment solution as the main component of the developing solution, namely, the one having a hydrogen bonding term of the Hansen solubility parameter of 10 $MPa^{1/2}$ or less. Further, the dispersing agent contained as the sub-component in the developing solution can use, as the surfactant, for example, the same activator used in the dispersing agent contained as the sub-component in the above embedding solution.

When performing the developing treatment by supplying the developing solution adjusted in component as above to the wafer W, the developing treatment may be completed in a state where the bottom of the protrusion of the pattern is locally made thick or in a state where a resist film thin enough with respect to the protrusion is left so as to join bottoms of a plurality of protrusions, to thereby suppressing the pattern collapse. An example of the thickness of the resist film thin enough with respect to the protrusion can be less than half of the height of the protrusion of the pattern.

Further, the wafer treatment apparatus disclosed this time is not limited to the above-explained configurations and operations. In the form according to the above embodiments, the wafer treatment apparatus is directly connected to the exposure apparatus and the wafer W is delivered between the interface station 12 and the exposure apparatus, but the wafer treatment apparatus does not need to be directly connected to the exposure apparatus. In this case, for example, the wafer W is subjected to necessary treatments in the treatment station 11 of the wafer treatment apparatus, then carried out from the cassette station 10 to the outside of the wafer treatment apparatus, and then carried to the exposure apparatus. Besides, an unnecessary one of the apparatuses (modules) which perform the treatments on the wafer W does not need to be provided in the wafer treatment apparatus, or the treatment in the apparatus (module) does not need to be performed.

The embodiments disclosed herein are examples in all respects and should not be considered to be restrictive. Various omissions, substitutions, and changes may be made in the embodiments without departing from the scope and spirit of the attached claims. For example, configuration requirements of the above embodiments can be arbitrarily combined. The operations and effects about the configuration requirements relating to an arbitrary combination can be obtained as a matter of course from the combination, and those skilled in the art can obtain clear other operations and other effects from the description herein.

Further, the effects described herein are merely explanatory or illustrative in all respects and not restrictive. The technique relating to this disclosure can offer other clear effects to those skilled in the art from the description herein together with or in place of the above effects.

Note that the following configuration examples also belong to the technical scope of this disclosure.

(1) A substrate treatment method including:

developing a substrate which has a coating film of an inorganic resist formed on a base film thereon and has been subjected to an exposure treatment, with a developing solution to form a pattern of the inorganic resist;

supplying an embedding solution to the developed substrate to fill a space between adjacent protrusions of the pattern;

drying the filled embedding solution to form an embedded film on the substrate; and reducing a thickness of the embedded film by an ultraviolet ray.

(2) The substrate treatment method according to the (1), wherein the base film and the embedded film are organic films of a same type.

(3) The substrate treatment method according to the (1) or (2), further including irradiating the base film with an ultraviolet ray under an oxygen-containing atmosphere before the coating film of the inorganic resist is formed on the base film.

(4) The substrate treatment method according to any one of the (1) to (3) further including supplying water to the base film or exposing the base film to an ozone atmosphere before the coating film of the inorganic resist is formed on the base film.

(5) The substrate treatment method according to any one of the (1) to (4), wherein the reducing the thickness of the embedded film removes the embedded film so as to leave the embedded film at a bottom between the patterns.

(6) The substrate treatment method according to any one of the (1) to (5), further including:

measuring a state of the pattern after the reducing the thickness of the embedded film; and making a decision relating to pattern collapse including a decision of a treatment condition relating to the embedded film based on a measurement result in the measuring.

(7) The substrate treatment method according to any one of the (1) to (6), wherein the embedding solution contains a component improving solubility of the inorganic resist with respect to the embedding solution, as a sub-component.

(8) A computer-readable storage medium storing a program running on a computer of a controller controlling a substrate treatment apparatus to cause the substrate treatment apparatus to execute a substrate treatment method, the substrate treatment method including:

developing a substrate which has a coating film of an inorganic resist formed on a base film thereon and has been subjected to an exposure treatment, with a developing solution to form a pattern of the inorganic resist;

supplying an embedding solution to the developed substrate to fill a space between the adjacent patterns, and then drying the filled embedding solution to form an embedded film on the substrate; and reducing a thickness of the embedded film by an ultraviolet ray.

(9) A substrate treatment apparatus for treating a substrate, including:

a developer configured to develop the substrate with a developing solution;

an embedder configured to supply an embedding solution to the substrate;

an ultraviolet irradiator configured to irradiate the substrate with an ultraviolet ray; and a controller, wherein the controller controls the substrate treatment apparatus to execute:

developing a substrate which has a coating film of an inorganic resist formed on a base film thereon and has been subjected to an exposure treatment, with the developing solution to form a pattern of the inorganic resist;

supplying the embedding solution to the developed substrate to fill a space between adjacent protrusions of the pattern;

drying the filled embedding solution to form an embedded film on the substrate; and reducing a thickness of the embedded film by the ultraviolet ray.

According to this disclosure, it is possible to obtain an excellent pattern of an inorganic resist.

What is claimed is:

1. A substrate treatment method comprising:

developing a substrate which has a coating film of an inorganic resist formed on a base film thereon and has been subjected to an exposure treatment, with a developing solution to form a pattern of the inorganic resist;

supplying an embedding solution to the developed substrate to fill a space between adjacent protrusions of the pattern;

drying the filled embedding solution to form an embedded film on the substrate; and reducing a thickness of the embedded film by an ultraviolet ray.

2. The substrate treatment method according to claim 1, wherein the base film and the embedded film are organic films of a same type.

3. The substrate treatment method according to claim 1, further comprising irradiating the base film with an ultraviolet ray under an oxygen-containing atmosphere before the coating film of the inorganic resist is formed on the base film.

4. The substrate treatment method according to claim 1, further comprising supplying water to the base film or exposing the base film to an ozone atmosphere before the coating film of the inorganic resist is formed on the base film.

5. The substrate treatment method according to claim 1, wherein the reducing the thickness of the embedded film removes the embedded film so as to leave the embedded film at a bottom between the patterns.

6. The substrate treatment method according to claim 1, further comprising:

measuring a state of the pattern after the reducing the thickness of the embedded film; and making a decision relating to pattern collapse including a decision of a treatment condition relating to the embedded film based on a measurement result in the measuring.

7. The substrate treatment method according to claim 1, wherein the embedding solution contains a component improving solubility of the inorganic resist with respect to the embedding solution, as a sub-component.

8. A computer-readable storage medium storing a program running on a computer of a controller controlling a substrate treatment apparatus to cause the substrate treatment apparatus to execute a substrate treatment method, the substrate treatment method comprising:

developing a substrate which has a coating film of an inorganic resist formed on a base film thereon and has been subjected to an exposure treatment, with a developing solution to form a pattern of the inorganic resist;

supplying an embedding solution to the developed substrate to fill a space between the adjacent patterns, and then drying the filled embedding solution to form an embedded film on the substrate; and reducing a thickness of the embedded film by an ultraviolet ray.

9. A substrate treatment apparatus for treating a substrate, comprising:

a developer configured to develop the substrate with a developing solution;

an embedder configured to supply an embedding solution to the substrate;

an ultraviolet irradiator configured to irradiate the substrate with an ultraviolet ray; and a controller, wherein the controller controls the substrate treatment apparatus to execute:

developing a substrate which has a coating film of an inorganic resist formed on a base film thereon and has been subjected to an exposure treatment, with the developing solution to form a pattern of the inorganic resist;

supplying the embedding solution to the developed substrate to fill a space between adjacent protrusions of the pattern;

drying the filled embedding solution to form an embedded film on the substrate; and reducing a thickness of the embedded film by the ultraviolet ray.

* * * * *